United States Patent

Tomita

Patent Number: 5,886,941
Date of Patent: Mar. 23, 1999

[54] ADDRESS DECODER AND ADDRESS DECODING METHOD

[75] Inventor: Shozo Tomita, Tokyo, Japan

[73] Assignee: Oki Electric Industry Co., Ltd., Tokyo, Japan

[21] Appl. No.: 889,495

[22] Filed: Jul. 8, 1997

[30] Foreign Application Priority Data

Aug. 20, 1996 [JP] Japan .................................. 8-218211

[51] Int. Cl.$^6$ ........................................................ G11C 8/00
[52] U.S. Cl. ........................................ 365/230.06; 365/233
[58] Field of Search .............................. 365/230.06, 233

[56] References Cited

U.S. PATENT DOCUMENTS

| | | | |
|---|---|---|---|
| 4,739,497 | 4/1988 | Itoh et al. | 365/230.06 |
| 5,398,206 | 3/1995 | Akizawa et al. | 365/230.06 |
| 5,659,514 | 8/1997 | Hazani | 365/230.06 |
| 5,699,317 | 12/1997 | Sartore et al. | 365/230.06 |
| 5,721,834 | 2/1998 | Milhaupt et al. | 365/230.06 |

FOREIGN PATENT DOCUMENTS

| | | |
|---|---|---|
| 54-152931 | 1/1979 | Japan . |
| 59-186190 | 10/1984 | Japan . |
| 4-195894 | 7/1992 | Japan . |

*Primary Examiner*—David Nelms
*Assistant Examiner*—M. Tran
*Attorney, Agent, or Firm*—Venable; Robert J. Frank

[57] ABSTRACT

There is provided an address decoder which allows a high-speed operation without causing a malfunction. When a pre-charge signal is in a state of being set at a logical level of "0", an address driver is brought into a state of being held at "1". When the pre-charge signal is in a state of being set to a logical level "1", the address driver outputs a drive signal pair which becomes positive phase and negative phase of an address signal to each of the drive signal lines. A detection circuit is connected to each signal line of at least one drive signal pair among a plurality of signal pairs at an end portion of the signal lines on the side opposite to the address driver. The decoding circuits all have the same circuit structure. Eight input terminals are connected to either one of the signal lines and are uniformly disposed along the drive signal lines. When the detection circuit monitors the change of either one of the signal lines connected thereto to "0" and detects determination of the input drive signals in the decoding circuit, a control circuit receives an outputted detection signal and changes the enable signal to "0" so as to be brought into a decode-enabled state.

16 Claims, 21 Drawing Sheets

DECODING CIRCUIT $j_0, j_1$

DECODING CIRCUIT $j_2, j_3$

ADDRESS DECODER AND ADDRESS DECODING METHOD

BACKGROUND OF THE INVENTION

1. Field of the Invention

The present invention relates to an address decoder in a synchronous memory module such as a synchronous high-speed SRAM module or the like.

2. Description of the Related Art

A synchronous memory module (which will be hereinafter referred to as a "module") has following various operations. First of all, it executes an operation of selecting a memory cell within the module, corresponding to a specified address determined by address data consisting of a plurality of externally inputted address signals. Secondly, it executes a reading operation for reading data stored in the selected memory cell and outputting the data out of the module, and thirdly it executes a writing operation for writing data inputted from an exterior of the module into the memory cell of the specified address.

In a synchronous high-speed SRAM module, following operations must be executed and completed at high speed within one cycle of a system clock (which will be hereinafter referred to as a "clock").

Namely, they are an operation of continuously selecting a memory cell and reading data from the memory cell, and an operation of continuously selecting a memory cell and writing data into the memory cell.

Within the module, the memory cells are formed as a memory array in such a manner as to be uniformly and densely arranged both in vertical and horizontal directions. The operation of selecting a memory cell of the specified address in the memory array includes a row (word) selecting operation for selecting the horizontal direction of the array from a plurality of address signals inputted from the exterior of the module and a row selecting operation for selecting the vertical direction of the array from these address signals. The above-described address decoder is used to decode address data consisting of a plurality of address signals and select only one word within the memory array.

FIG. 20 is a circuit diagram which shows an example of a conventional address decoder. The address decoder includes a control circuit 1001, an address driver 1002, and a decoding circuit row i consisting of 256 decoding circuits $i_0$ through $i_{255}$.

The address driver 1002 generates drive signals $d_n$ and $rd_n$ (n=0, 1 . . . 7) which are positive-phase and negative-phase signals of an input address signal $A_n$ (n=0, 1 . . . 7).

FIG. 21 is a circuit diagram which shows a structural example of the address driver 1002. Driving circuits $D_0$ through $D_7$ provided to respectively correspond to address signals $A_0$ to $A_7$ all have the same circuit structure. In the drive circuit $D_n$ corresponding to the address signal $A_n$, a D-type flip-flop circuit (F/F circuit) 200 latches the address signal $A_n$ at a rising edge of a clock signal CK. Output of the F/F circuit 200 is outputted as the drive signal $d_n$ via NOT circuits 201, 202, and is further outputted as the drive signal $rd_n$ via a NOT circuit 203. Namely, the drive signal $d_n$ outputs a logical level of the same phase as that of the address signal $A_n$ and the drive signal $rd_n$ outputs a logical level whose phase is opposite to that of the logical level of the address signal $A_n$.

The control circuit 1001 inputs an externally inputted clock signal CK, a function selecting signal SEL which designates operation of the module, and a reading operation signal SAD from the memory module. The control circuit 1001 generates, from these input signals, an enable signal EN which permits or prohibits operation of the decoding circuit row i, and a pre-charge signal NPR which controls reading and/or writing operation of the memory module.

FIG. 22 is a circuit diagram which shows a structural example of the control circuit 1001. In this figure, F/F circuit 100 latches the function selecting signal SEL at the rising edge of the clock signal CK to generate the pre-charge signal NPR. Further, a NAND circuit 102 to which an inverted signal of the pre-charge signal NPR is inputted and a NAND circuit 103 to which an inverted signal of the reading operation signal SAD is inputted composes an SR latch circuit, and output of the NAND circuit 103 forms an output terminal of the enable signal EN.

The decoding circuit row i selects, by the decoding circuits $i_0$ through $i_{255}$, one word line among 256 word lines $W_0$ through $W_{255}$, which are designated by 16 drive signals $d_0$ through $d_7$ and $rd_0$ through $rd_7$ inputted from the address driver 1002. These decoding circuits $i_0$ through $i_{255}$ have the same circuit structure, each having eight input terminals $I_0$ through $I_7$. When the logical level of the enable signal EN is "0", the decoding circuit $i_m$ (m=0, 1 . . . 255) outputs logical product (the AND) of eight input signals to the word line $W_m$, and when the logical level of the enable signal EN is "1", the decoding circuit $i_m$ outputs a logical level "0" to the word line $W_m$ irrespective of each logical level of the input signals.

In FIG. 20, 256 word lines $W_0$ through $W_{255}$ are used to select a row (word) of a memory array (not shown, but the memory array described herein consists of 256 words) in which memory cells are arranged in the form of an array. The word line $W_m$ is connected to a selection gate (not shown) of a memory cell of a corresponding word. When data consisting of address signals $A_0$ through $A_7$ is the one that indicates an address space of the m-th address (i.e., a word of the m-th address) within the memory array (in this case, it is assumed that a depth-wise direction for 1-bit data to be written into/read from the module is given as 256, i.e., the number of row is given as 1), the decoding circuit $i_m$ outputs and selects a logical level "1" to the word line $W_m$ corresponding to the word. Accordingly, when data consisting of the address signals $A_0$ through $A_7$ indicates the m-th address, the input terminal $I_n$ of the decoding circuit $i_m$, which corresponds to the address signal $A_n$ having the logical level "1", is connected to the drive signal $d_n$ and the input terminal $I_n$ of the decoding circuit $i_m$, which corresponds to the address signal $A_n$ having the logical level "0", is connected to the drive signal $rd_n$.

Next, a decoding operation of the address decoder shown in FIG. 20 will be described. FIG. 23 is an operational timing chart of the address decoder shown in FIG. 20. Note that only the decoding operation in a data reading cycle will be described hereinafter, and a description of the decoding operation in a data writing cycle which is similar to the above will be omitted.

In a waiting state in which the function selecting signal SEL is "0", the pre-charge signal NPR has a logical level "0", the reading operation signal SAD has a logical level "0", and the enable signal EN has a logical level "1".

When the function selecting signal SEL becomes "1", in FIG. 22, the F/F circuit 100 latches the function selecting signal SEL at the rising edge of the clock signal CK so that the pre-charge signal NPR becomes "1" to be brought into a discharge state. When the pre-charge signal NPR changes as described above, output of the NOT circuit 101 becomes "0", output of the NAND circuit 102 changes to "1", and three inputs of the NAND circuit 103 all become "1", so that the enable signal EN changes to "0".

In accordance with the logical levels of the drive signals $d_0$ through $d_7$ and $rd_0$ through $rd_7$ from the address driver 1002, only one decoding circuit $i_m$ outputs "1" to the word line $W_m$ and a memory cell connected to the word line $W_m$ is thereby selected. When reading of data from the memory cell is completed, the module allows the reading operation signal SAD to be set to be "1".

As a result, in FIG. 22, output of the NOT circuit 104 becomes "0", and therefore, output of the NAND circuit 103 changes to "1" and the enable signal EN returns to "1". Further, since three inputs of the AND circuit 105 all becomes "1", output of the AND circuit 105 becomes "1", the F/F circuit 100 is reset, and the pre-charge signal NPR returns to "0" to be brought into a pre-charge state. As a result, the decoding operation of one cycle is completed.

The synchronous high-speed. SRAM executes operations for writing and reading data into and from a memory cell during one clock cycle. In either case, it is necessary for the SRAM to complete these operations within one clock cycle starting from inputting of the address signals $A_n$ and to return to a waiting state for the subsequent one clock cycle. At this time, an access-cycle start condition is supplied from the exterior of the module, but a timing element for controlling the interior of the memory module cannot be supplied from the exterior of the module. For this reason, if necessary, there is no alternative but to generate the timing element within the module. Accordingly, the operation within the module must be constructed by asynchronous logics.

In the address decoder of the synchronous memory module like the above, supply of the drive signals for a large number of uniformly arranged decoding circuits allows driving of a long wire connected to a large number of loads, i.e., driving of a large load capacity. At this time, a wave form of a signal which reaches a decoding circuit located at a leading end portion of a drive signal line from the address driver delays greatly as compared with a decoding circuit located near to the address driver.

Accordingly, there is a possibility that the phase relationship of the enable signal EN and the drive signals $d_n$ and $rd_n$ greatly differs between the decoding circuit near to the address driver and the decoding circuit located at the leading end portion of the drive signal line. For this reason, it is not possible to ensure whether or not the set-up time and holding time of the address signals $A_n$ with respect to the enable signal EN is secured. In other words, the drive signals $d_n$ and $rd_n$ may change in a period in which the enable signal EN is "0". Accordingly, there is a possibility that a plurality of word lines may be temporarily selected and a wrong word (memory cell) may thereby be selected. When illustrated with reference to FIG. 23, in the decoding circuit located at the leading end portion of the drive signal line, there is a possibility that the enable signal EN may become "0" before the drive signals $d_n$ and $rd_n$ change.

In the address decoder, it is necessary to secure the set-up time which indicates how long it takes from the time of the address signal being fixed to the falling edge of the enable signal EN, and the holding time which indicates how long it takes from the rising edge of the enable signal to the time when the logical level of the address signal changes.

As described above, the conventional address decoder has a problem in that it is not possible to sufficiently secure the set-up time and a malfunction thereby occurs in which read data from the memory cell is brought into an abnormal logical level.

SUMMARY OF THE INVENTION

The present invention has been achieved to solve the above-described problems and an object of the present invention is to provide an address decoder which allows high-speed operation without causing a malfunction.

In order to solve the problems aforementioned, the address decoder according to the first embodiment of the present invention is constructed such that it comprises: an address driver to which a plurality of address signals are inputted and which generates a pair of drive signals for each of the plurality of address signals and outputs the pair of drive signals to a corresponding pair of drive signal lines which are provided separately, which pair of drive signals both becoming a first logical level in a memory pre-charge period irrespective of a logical level of an inputted address signal, and outputting a positive phase and a negative phase of a logical level of the inputted address signal in a memory discharge period so as to respectively form the first logical level and a second logical level which are different from each other; a decoding circuit row having a plurality of decoding circuits whose number is same as that of the word lines of the memory module, which decoding circuits each including an enable terminal connected to an enable signal line and a plurality of input terminals which are each connected to either one predetermined signal line of a corresponding pair of drive signals and each decoding the corresponding pair of drive signals in a period in which the enable signal is inputted to the enable terminal; a detection circuit which is connected to at least one selected pair of drive signal lines among the plurality of pairs of drive signal lines at end portions of the selected pair of drive signal lines on a side opposite to the address driver and which outputs a detection signal which detects that either one of the selected pair of drive signals has changed to the second logical level; and a control circuit which outputs the enable signal when the detection signal is inputted thereto.

The address decoder according to the second embodiment of the present invention comprises: an address driver to which a plurality of address signals are inputted and which generates, for at least one address signal, a pair of drive signals and outputs the pair of drive signals to a corresponding pair of drive signal lines, which pair of drive signals both becoming a first logical level in a memory pre-charge period irrespective of a logical level of an inputted address signal, and outputting a positive phase and a negative phase of a logical level of the inputted address signal during a memory discharge period, so as to respectively form the first logical level and a second logical level which are different from each other, and further which generates, for each of other address signals, a single drive signal which outputs the same phase of the logical level of each inputted address signal irrespective of the memory pre-charge period or the discharge period, which address driver outputting these drive signals to drive signal lines which are separately provided; a first decoding circuit row having a plurality of first decoding circuits whose number is same as that of word lines of the memory module, which first decoding circuits inputting the single drive signals and inverting a logical level of predetermined signals of the inputted single drive signals to generate separate drive signals; a second decoding circuit row having a plurality of second decoding circuits provided to respectively correspond to the first decoding circuits, which second decoding circuits each including an enable terminal connected to an enable signal line, a plurality of input terminals respectively connected to separate drive signal lines which output the separate drive signals fed from said first decoding circuits and an input terminal connected to a predetermined either one of the pair of drive signal lines, each decoding the drive signals in a period in which the enable signal is inputted to the enable terminal; a detection circuit which is connected to the drive signal lines of the pair of drive signals at end portions of the pair of drive signal lines on a side opposite to the address driver and which outputs a detection signal which detects that either one of the pair of drive signal lines has changed to the second logical level; and a control circuit which outputs the enable signal when the detection signal is inputted thereto.

The address decoder according to the third embodiment of the present invention based on the structure of the first embodiment is characterized in that the address driver includes an input terminal of a pre-charge signal and operates in a pre-charge period in which the pre-charge signal is inputted to the address driver and in a discharge period in which the pre-charge signal is not inputted thereto, the control circuit stops output of the pre-charge signal synchronously with a rising edge of an externally inputted clock, and when a first detection signal is inputted, generates and outputs the enable signal to the enable signal line, stops output of the enable signal when data reading or writing operation is completed in the memory module, and further restarts output of the pre-charge signals when a second detection signal is inputted, and the detection circuit is connected to at least one pair of drive signal lines among the plurality of pairs of drive signal lines at end portions of the pair of signal lines on the side opposite to the address driver and is also connected to the enable signal line at an end portion of the enable signal line on the side opposite to said control circuit, and further outputs the first detection signal which detects that either one of said at least one pair of drive signal lines has changed to a second logical level and the second detection signal which detects that input of the enable signal from the enable signal line has stopped.

The address decoder according to the fourth embodiment of the present invention based on the structure of the first embodiment is characterized in that the address driver includes an input terminal of a pre-charge signal and operates in a pre-charge period in which the pre-charge signal is inputted to the address driver and in a discharge period in which the pre-charge signal is not inputted thereto, the control circuit is connected to an end portion of the enable signal line and stops output of the pre-charge signal synchronously with a rising edge of an externally inputted clock, outputs a detection inhibiting signal when data reading or writing operation is completed in the memory module, and further restarts output of the pre-charge signal when it is detected that input of the enable signal from the enable signal line has stopped, and the detection circuit is connected to at least one pair of drive signal lines of the plurality of pairs of drive signals at end portions of each of the pair of signal lines on the side opposite to the address driver and is also connected to the enable signal line at an end portion of the enable signal line on the side opposite to said control circuit, and further generates the enable signal which detects that either one of the at least one pair of drive signal lines has changed to a second logical level and outputs the enable signal to the enable signal line, and when the detection inhibiting signal is inputted, said detection circuit stops output of the enable signal.

DESCRIPTION OF THE PREFERRED EMBODIMENTS

[First Embodiment]

Figure 1:
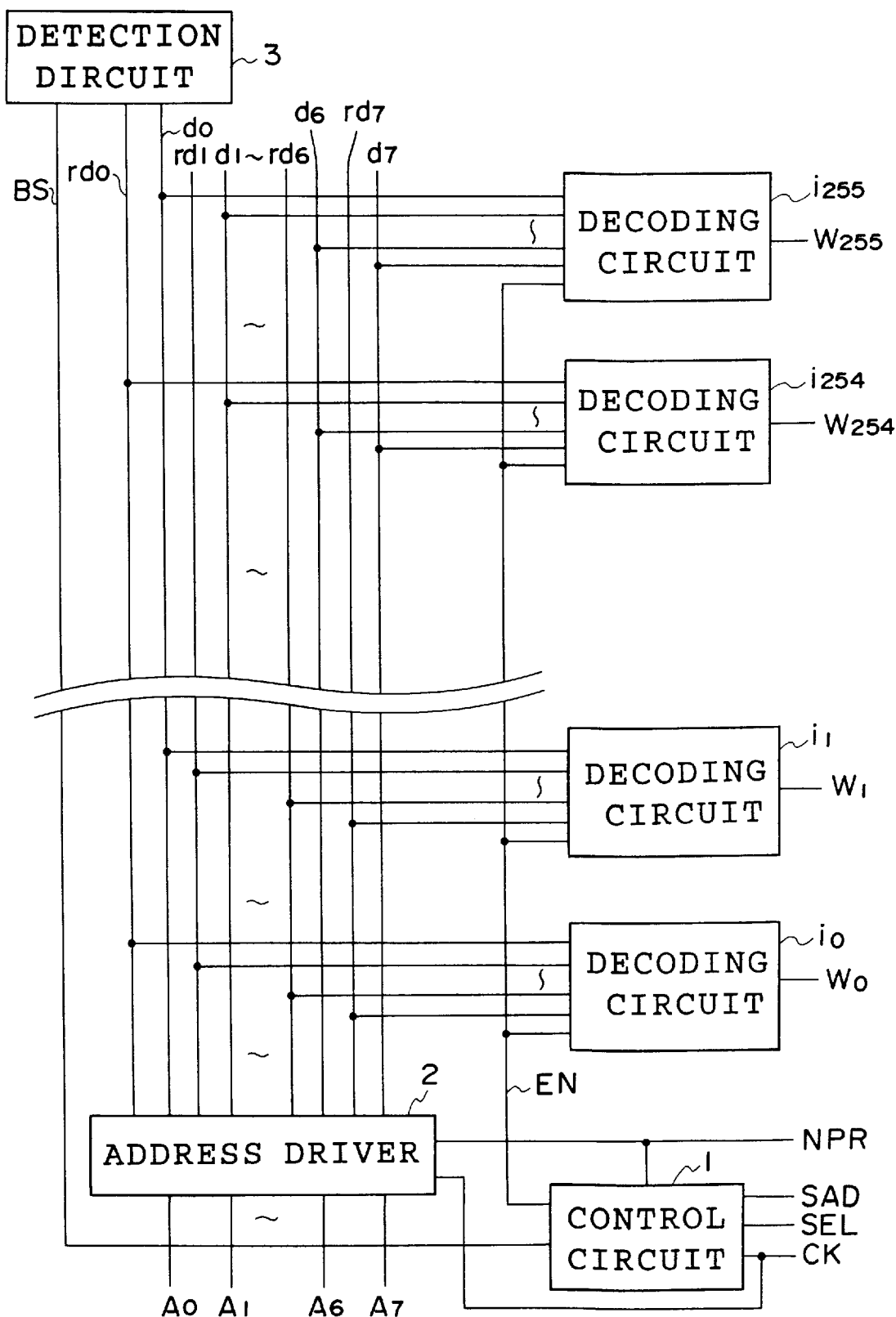
FIG. 1 is a circuit diagram which shows an address decoder according to a first embodiment of the present invention.

FIG. 1 is a circuit diagram which shows an address decoder according to a first embodiment of the present invention, the address decoder being provided in a synchronous high-speed SRAM module. The address decoder includes a control circuit 1, an address driver 2, a decoding circuit row i consisting of 256 decoding circuits $i_0$ through $i_{255}$, and a detection circuit 3. Further, the above SRAM module has a memory cell array consisting of 256 words.

The address driver 2 generates, from eight input address signals $A_0$ through $A_7$, 16 drive signals $d_0$ through $d_7$ and $rd_0$ through $rd_7$ which are to be inputted to the decoding circuit row i, and outputs these drive signals to separate drive signal lines. At the time of memory pre-charge (hereinafter referred to simply as "pre-charge"), the drive signals $d_n$ and $rd_n$ (n=0, 1 . . . 7) both output the logical level "1" (hereinafter referred to simply as "1"). Further, at the time of memory discharge (hereinafter referred to simply as "discharge"), the drive signal $d_n$ latches and outputs the positive-phase logical level of an address signal $A_n$ and the drive signal $rd_n$ latches and outputs the negative-phase logical level of the address signal $A_n$. Either one of the drive signals $d_n$ and $rd_n$ outputs "1" and the other one outputs the logical level "0"(hereinafter referred to simply as "0"). Note that "1" corresponds to a first logical level and "0" corresponds to a second logical level.

Figure 2:
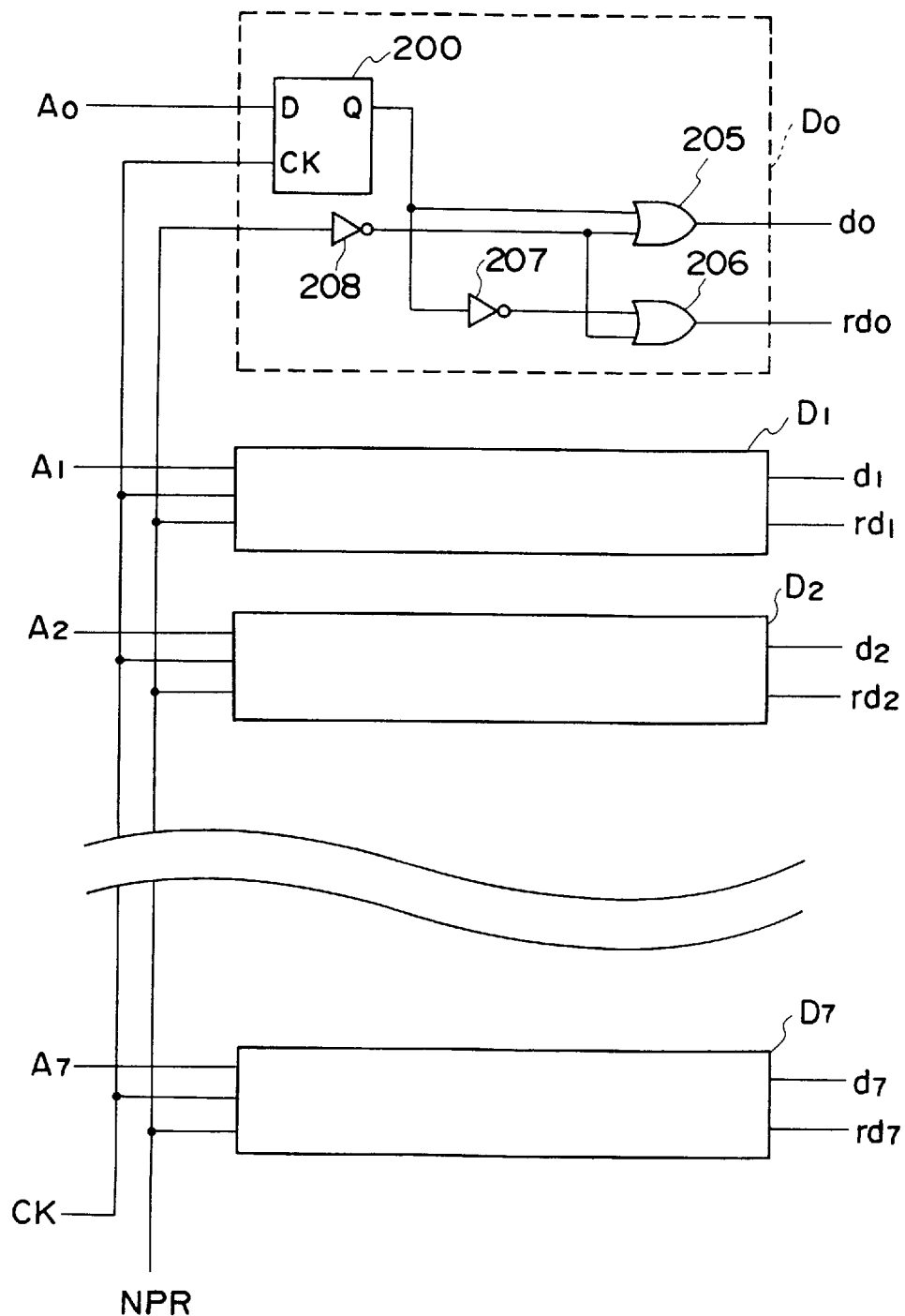
FIG. 2 is a circuit diagram which shows a structural example of an address driver in the address decoder of the first embodiment.

FIG. 2 is a circuit diagram which shows a structural example of the address driver 2 and driving circuits $D_0$ through $D_7$ provided to respectively correspond to eight address signals $A_0$ through $A_7$ have the same circuit structure. In the driving circuit $D_n$ corresponding to the address signal $A_n$, a flip-flop circuit (hereinafter referred to as F/F circuit) 200 allows the address signal $A_n$ to be connected to a D input terminal thereof, allows a clock signal CK to be connected to a clock input terminal, and latches the logical level of the address signal $A_n$ due to rising of the clock signal CK. Output of the F/F circuit 200 is connected to an input terminal of a NOT circuit 207 and to a first input terminal of an OR circuit 205, and output of the NOT circuit 207 is connected to a first input terminal of an OR circuit 206. A pre-charge signal NPR is connected to an input terminal of a NOT circuit 208 and output of the NOT circuit 208 is connected to respective second input terminals of OR circuits 205 and 206. Respective outputs of the OR circuits 205 and 206 form output terminals of the address driver 2. Namely, output of the OR circuit 205 becomes an output terminal of a positive-phase drive signal $d_n$ and output of the OR circuit 206 becomes an output terminal of a negative-phase drive signal $rd_n$.

Accordingly, in a pre-charge state in which the pre-charge signal NPR is "0", output of the NOT circuit 208 becomes "1", and respective outputs of the OR circuits 205 and 206 are maintained at "1" irrespective of the logical level of the output of the F/F circuit 200, and further, "1" is forcibly outputted to both of the drive signals $d_0$ and $rd_0$. In a discharge state in which the pre-charge signal NPR is "1", output of the NOT circuit 208 becomes "0", a positive phase of output of the F/F circuit 200 is outputted from the OR circuit 205 and a negative phase of output of the F/F circuit 200 is outputted from the OR circuit 206.

The detection circuit 3 inputs a pair of drive signals $d_0$ and $rd_0$ from the address driver 2 through respective drive signal lines $d_0$ and $rd_0$ and monitors each logical level of the drive signals $d_0$ and $rd_0$. When the detection circuit 3 detects that the logical level of one of the drive signals is "0", it outputs a detection signal BS. In the mask pattern (hereinafter referred to simply as "layout") of a semiconductor integrated circuit, the detection circuit 3 is connected to the address driver 2 at ends of the drive signal lines $d_0$ through $d_7$ and $rd_0$ through $rd_7$ extended from the address driver 2, the drive signal lines being arranged in parallel with a direction in which the decoding circuits $i_0$ through $i_{255}$ are arranged, i.e., the end portions of the drive signal lines located on the side opposite to the address driver 2. Meanwhile, the above-described pair of drive signals sent through the drive signal lines are not limited to the drive signals $d_0$ and $rd_0$, for example, the drive signals $d_1$ and $rd_1$ sent through the drive signal lines $d_1$ and $rd_1$ may be used and a plurality of drive signal pairs may also be monitored.

Figure 3:
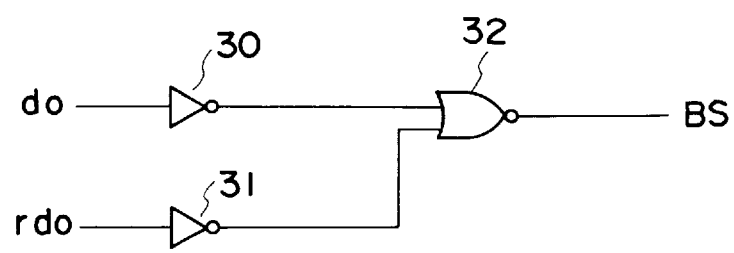
FIG. 3 is a circuit diagram which shows an example of a detection circuit in the address decoder of the first embodiment.

FIG. 3 is a circuit diagram which shows an example of the detection circuit 3. In this figure, the drive signals $d_0$ and $rd_0$ are respectively connected to input terminals of NOT circuits 30 and 31, each output of the NOT circuits 30 and 31 are respectively connected to two input terminals of a NOR circuit 32, and output of the NOR circuit 32 forms the detection signal BS.

When either one of the drive signals $d_0$ and $rd_0$ becomes "0", either one of the two input terminals of the NOR circuit 32 becomes "1" and the detection signal BS becomes "0". Namely, when it is detected that the input of one of the NOT circuits 30 and 31 is "0", the detection signal BS becomes "0".

The control circuit 1 allows input of the externally supplied clock signal CK, the function selecting signal SEL, the reading operation signal SAD from the module, and the detection signal BS from the detection circuit 3, and generates, from these input signals, the enable signal EN which permits or inhibits the operation of the decoding circuit row i and the pre-charge signal NPR which controls the module reading operation.

Figure 4:
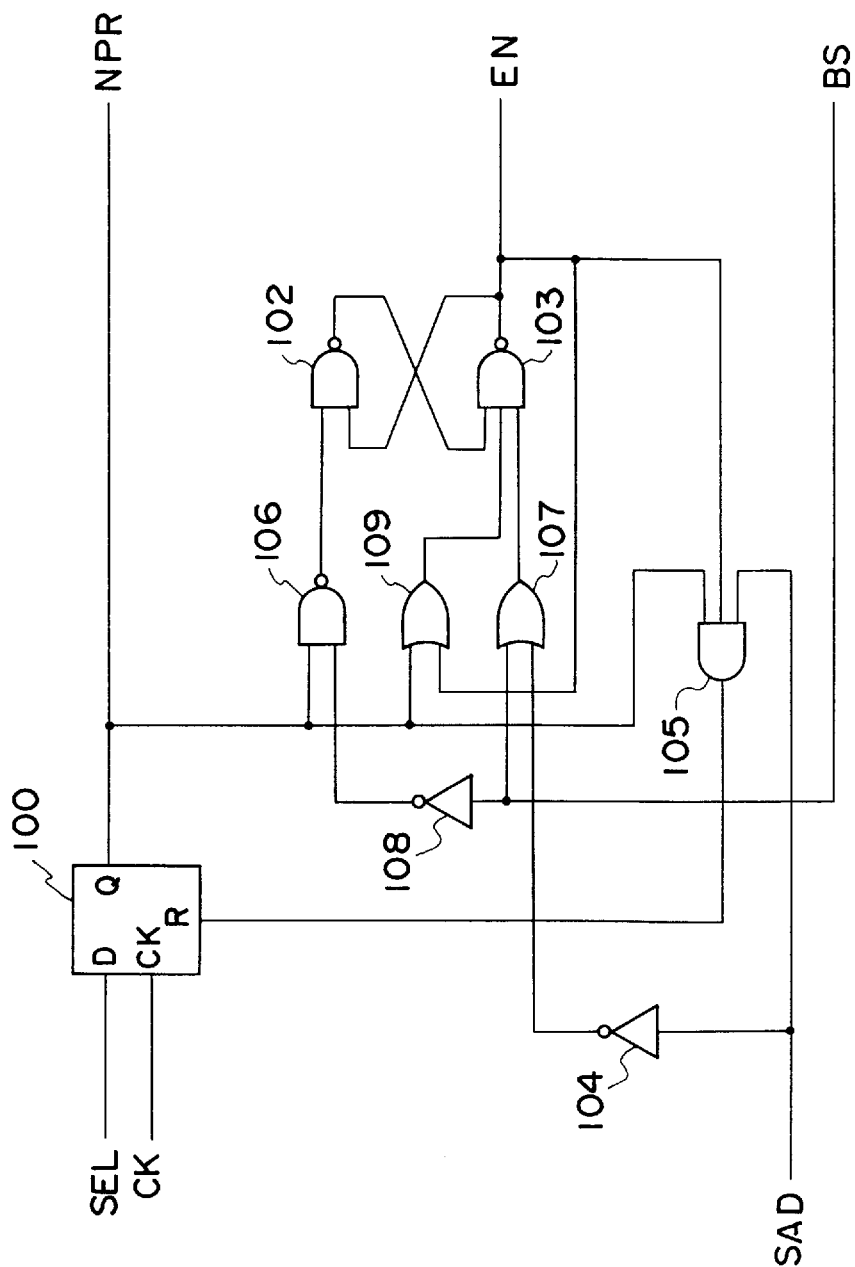
FIG. 4 is a circuit diagram which shows a structural example of a control circuit in the address decoder of the first embodiment.

FIG. 4 is a circuit diagram which shows a structural example of the control circuit 1. In this figure, the F/F circuit 100 is constructed such that its D input terminal is connected to the function selecting signal SEL and its clock input terminal CK is connected to the clock signal CK. Further, the F/F circuit 100 latches the function selecting signal SEL to generate the pre-charge signal NPR. The pre-charge signal NPR is connected to a first input terminal of a NAND circuit 106 and to a first input terminal of an AND circuit 105, and further connected to a first input terminal of an OR circuit 109. The detection signal BS is connected to an input terminal of a NOT circuit 108 and also to a first input terminal of an OR circuit 107. Output of the NOT circuit 108 is connected to a second input terminal of the NAND circuit 106. Output of the NAND circuit 106 is connected to a first input terminal of a NAND circuit 102. The reading operation signal SAD is connected to a second input terminal of the AND circuit 105 and also to an input terminal of a NOT circuit 104, and output of the NOT circuit 104 is connected to a second input terminal of the OR circuit 107. Output of the OR circuit 107, output of the OR circuit 109, and output of the NAND circuit 102 are connected to first, second and third input terminals of a NAND circuit 103, respectively. An output terminal of the NAND circuit 103 generates the enable signal EN and is connected to a second input terminal of the NAND circuit 102, and further connected to a third input terminal of the AND circuit 105 and also to a second input terminal of the OR circuit 109. Output of the AND circuit 105 is connected to a reset input terminal R of the F/F circuit 100. Meanwhile, the OR circuit 109 is used to prevent the enable signal EN from being maintained at "0" in a waiting state. When the pre-charge signal NPR is "0" and the enable signal EN is "0", a feedback operation is executed by setting the output of the OR circuit 109 to be "0", and thus the output of the NAND circuit 103 is to be "1". As a result, the enable signal EN is returned to an original waiting state.

The decoding circuit row i selects, by the decoding circuits $i_0$ through $i_{255}$, one word line among 256 word lines $W_0$ through $W_{255}$ which are designated by 16 drive signals $d_0$ through $d_7$ and $rd_0$ through $rd_7$ inputted from the address driver 2. The decoding circuits $i_0$ through $i_{255}$ all have the same circuit structure and the enable signal EN from the control circuit is commonly inputted, as a decode-operation permission signal, to these decoding circuits. In the integrated circuit layout, these decoding circuits are uniformly arranged such that the decoding circuit $i_0$ is located nearest to the address driver 2 and the decoding circuit $i_{255}$ is located farmost from the address driver 2. Output of the decoding circuit $i_m$ (m=0, 1 . . . 255) is connected to a word line $W_m$. Note that provision of the decoding circuits having the same structure in the decoding circuit row i means that these decoding circuits can easily correspond to alteration of circuits such as an increase in number of words in the memory array.

Figure 5:
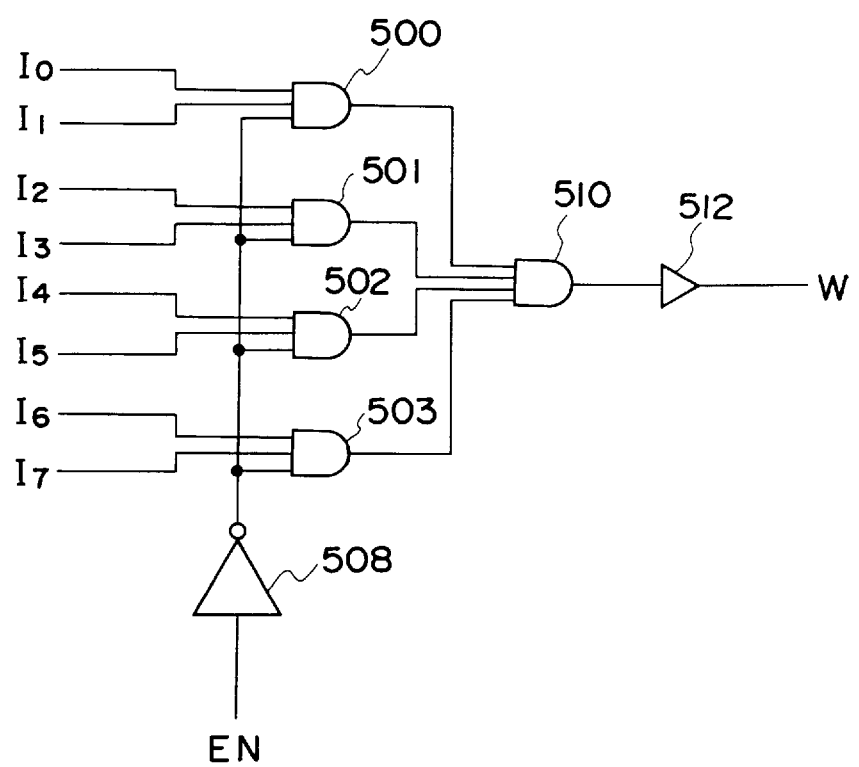
FIG. 5 is a circuit diagram which shows a structural example of a decoding circuit in the address decoder of the first embodiment.

FIG. 5 is a circuit diagram which shows a structural example of the decoding circuit $i_m$. In this figure, the input terminal $I_n$ is connected to either one of the drive signals $d_n$ and $rd_n$ which are outputted from the address driver 2. Input terminals $I_0$ and $I_1$ are respectively connected to first and second input terminals of an AND gate circuit 500 and output of a NOT circuit 508 is connected to a third input terminal of the AND circuit 500. Further, the enable signal EN is connected to an input terminal of the NOT circuit 508. Only when output of the NOT circuit 508 is "1" (the enable signal is "0"), the AND circuit 500 outputs the logical product of the signal input terminals $I_0$ and $I_1$. In the same way as in the input terminals $I_0$ and $I_1$, input terminals $I_2$ and $I_3$ are connected to input terminals of an AND circuit 501, input terminals $I_4$ and $I_5$ are connected to input terminals of an AND circuit 502, and input terminal $I_6$ and $I_7$ are connected to input terminals of an AND circuit 503. Output terminals of the AND circuits 500, 501, 502 and 503 are respectively connected to first, second, third and fourth input terminals of an AND circuit 510 which outputs the logical product of the four inputs. Further, output of the AND circuit 510 is connected to an input terminal of a driver circuit 512 having high driving capability and the driver circuit 512 outputs a signal whose phase is the same as that of the output of the AND circuit 510 to the word line $W_m$.

Accordingly, when the enable signal EN is "0", the logical product (AND) of the logical levels of the input terminals $I_0$ through $I_7$ is outputted to the word line $W_m$, and when the enable signal EN is "1", "0" is outputted to the word line $W_m$ irrespective of the logical levels of the input terminals $I_0$ through $I_7$.

256 word lines $W_0$ through $W_{255}$ are each connected to a corresponding word (strictly describing, a selection gate of a memory cell which forms the corresponding word) within the memory cell array.

The address driver 2 and the decoding circuit row i select a word (address space) which is selectively specified by the address signals $A_0$ through $A_7$ by setting the logical level of the word line corresponding to the specified word to "1".

All of the input terminals $I_n$ of the decoding circuit $i_0$ is connected to the drive signals $rd_n$ extended from the address driver 2, and when data consisting of the address signals $A_0$ through $A_7$ in which the address signal $A_0$ is the least significant bit is "00000000" which indicates (a word of) the 0-th address in the memory cell array (at this time, the drive signals $rd_0$ through $rd_7$ all become "1"), the word line $W_0$ becomes "1" and a word of the 0-th address is thereby selected. Further, the input terminal $I_0$ of the decoding circuit $i_1$ is connected to the drive signal $d_0$ and input terminals $I_1$ through $I_7$ are respectively connected to the drive signals $rd_1$ through $rd_7$. When data consisting of the address signals $A_0$ through $A_7$ is "00000001" (at this time, drive signals $d_0$, $rd_1$ through $rd_7$ all become "1"), the word line $W_1$ becomes "1" and a word of the 1-st address is thereby selected.

As described above, when the address space specified by the address signals $A_0$ through $A_7$ is the m-th address, the decoding circuit $i_m$ is a decoder which selects the word line $W_m$ corresponding to the m-th address. When data consisting of the address signals $A_0$ through $A_7$ indicates the m-th address, the input terminals $I_n$ of the decoding circuit $i_m$, which corresponds to the address signals $A_n$ set to "1", are connected to the drive signals $d_n$, and the input terminals $I_n$ of the decoding circuit $i_m$, which corresponds to the address signal $A_n$ set to "0", are connected to the drive signals $rd_n$. Namely, in the integrated circuit layout, the connection of the drive signal lines $d_n$ and $rd_n$ with the input terminal $I_n$ of the decoding circuit $i_m$ should be arranged such that when address data consisting of address signals $A_0$ through $A_7$ indicates the m-th address, the decoding circuit $i_m$ outputs "1".

Further, in the integrated circuit layout, the decoding circuits $i_m$ are arranged such that as the numerical value of "m" increases, the decoding circuit $i_m$ is disposed farther from the address driver 2. In other words, the decoding circuit $i_0$ is disposed in the vicinity of the address driver 2 and the decoding circuit $i_{255}$ is disposed farmost from the address driver 2. The signal lines of the drive signals $d_n$ and $rd_n$ are disposed in parallel with the positions of the decoding circuits $i_0$ through $i_{255}$, and also arranged in such a manner as to be parallel with one another. The wires forming the signal lines have the same materials and the same line width. Further, the number of wires for connection between the drive signals and the decoding circuit row i is all the same. This means that wiring capacity and wiring resistance contained in each drive signal line, and load capacity are all the same, namely, a delaying factor for transmission of an electric signal resides uniformly in each drive signal line. Further, the distance between the drive signal lines extended from respective output terminals of the address driver 2 and the respective contact points of the input terminals $I_0$ through $I_7$ of any one decoding circuit $i_m$ is substantially equal and the phase difference between the drive signals inputted to one decoding circuit $i_m$ can be thereby ignored.

Figure 6:
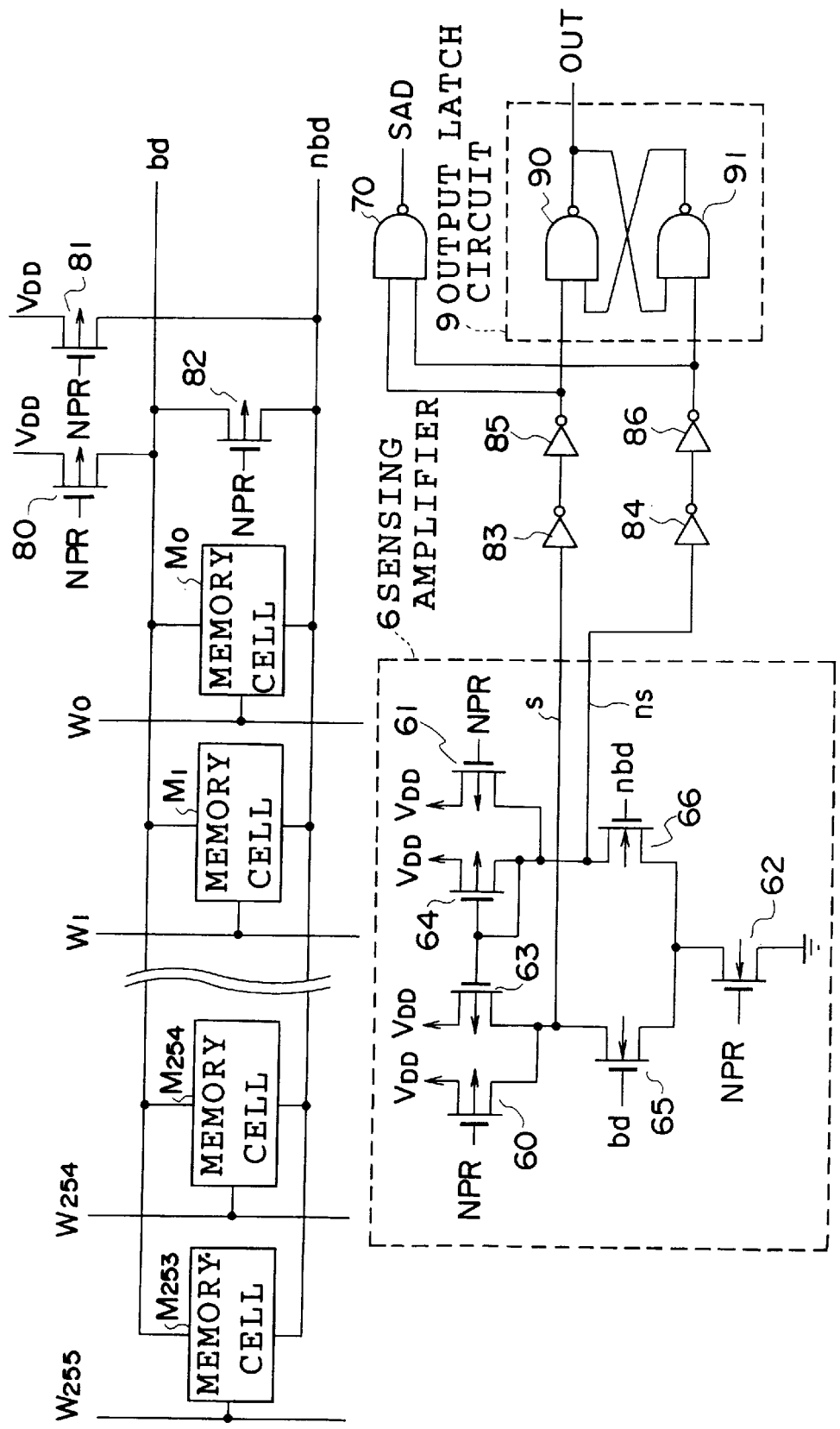
FIG. 6 is a circuit diagram including a memory array section and an output circuit with regard to reading of one-bit memory in an SRAM module to which the address decoder of the first embodiment is applied.

The structure and operation of a memory array section and an output circuit in the SRAM module of the present invention will be described hereinafter. FIG. 6 is a circuit diagram including the memory array section and the output circuit with regard to reading of one-bit data in the SRAM module. In this figure, positive-phase data input/output terminals and negative-phase data input/output terminals of 256 memory cells $M_0$ through $M_{255}$ which are arranged in the word direction are connected in common with one another to form bit lines bd and nbd, and the word line $W_m$ whose one end is connected to the decoding circuit row i shown in FIG. 1 is connected to a selection gate (not shown) of the memory cell $M_m$. Drain terminals of PMOS transistors (hereinafter referred to as "PMOS") 80 and 81 are respectively connected to bit lines bd and nbd, source terminals thereof are each connected to a power source terminal VDD, and gate terminals thereof are each connected to the precharge signals NPR from the control circuit 1 shown in FIG.

1. Further, the source terminal and the drain terminal of PMOS 82 are respectively connected to the bit lines bd and nbd and the gate terminal of PMOS 82 is connected to the pre-charge signal NPR.

When the pre-charge signal NPR is "0" (in the pre-charge state), the bit lines bd and nbd are pre-charged to a VDD level, which is a power source potential, and when the pre-charge signal NPR is "1" (in the discharge state), these bit lines are brought into an open state. When PMOS 82 is in the pre-charge state, it shorts the bit lines bd and nbd so that the bit lines bd and nbd are maintained at the same electric potential.

The above-described bit lines bd and nbd are connected to a differential input terminal of a sensing amplifier 6, and therefore, a potential difference between the bit lines bd and nbd is amplified by the sensing amplifier 6 to be inverted and outputted to the output terminals s and ns. In the sensing amplifier 6, NMOS transistor (hereinafter referred to as "NMOS") 62 is formed as a current source, NMOS 65 and 66 are each formed as a differential input transistor, a differential amplifier circuit having a constant-current load circuit consisting of PMOS 63 and 64 is formed, and PMOS 60 and 61 are provided in which gate terminals thereof are controlled by the pre-charge signal NPR, source terminals thereof are each connected to the power source terminal VDD, and drain terminals thereof are respectively connected to output terminals s and ns. The sensing amplifier 6 is brought into an operating state at the time of discharge and is brought into a non-operating state at the time of pre-charge, and the output terminals s and ns are each pulled up to the power source potential VDD.

The output terminals s and ns of the sensing amplifier 6 are respectively connected to input terminals of NOT circuits 83 and 84 each having a threshold value which is a half or less of the power source potential VDD, and the logical level "0" or "1" is detected by the NOT circuits 83 and 84 on the basis of the signal levels of the output terminals s and ns. Output of the NOT circuit 83 is reshaped by a NOT circuit 85 and is connected to a first input terminal of a NAND circuit 90. Further, output of the NOT circuit 84 is reshaped by a NOT circuit 86 and is connected to a first input terminal of a NAND circuit 91. Output of the NAND circuit 90 is connected to a second input terminal of the NAND circuit 91 and output of the NAND circuit 91 is connected to a second input terminal of the NAND circuit 90. The NAND circuits 90 and 91 form an output latch circuit 9 serving as an SR latch circuit which sets the outputs of the NOT circuits 85 and 86 as setting and resetting inputs. Output of the NAND circuit 90 is outputted, as data read from the memory cell $M_m$ (m=0, 1 ... 255), to the output terminal OUT.

The actual SRAM module stores data being a width formed by a plurality of bits and the circuits shown in FIG. 6 are arranged in a row direction for the number of bits forming the width. As shown in FIG. 6, a NAND circuit 70 in which outputs of the NOT circuits 85 and 86 are connected to two input terminals of the NAND circuit 70 and which generates the reading operation signal SAD is provided at the far end side of the bit circuits arranged in the column direction.

Figure 7:
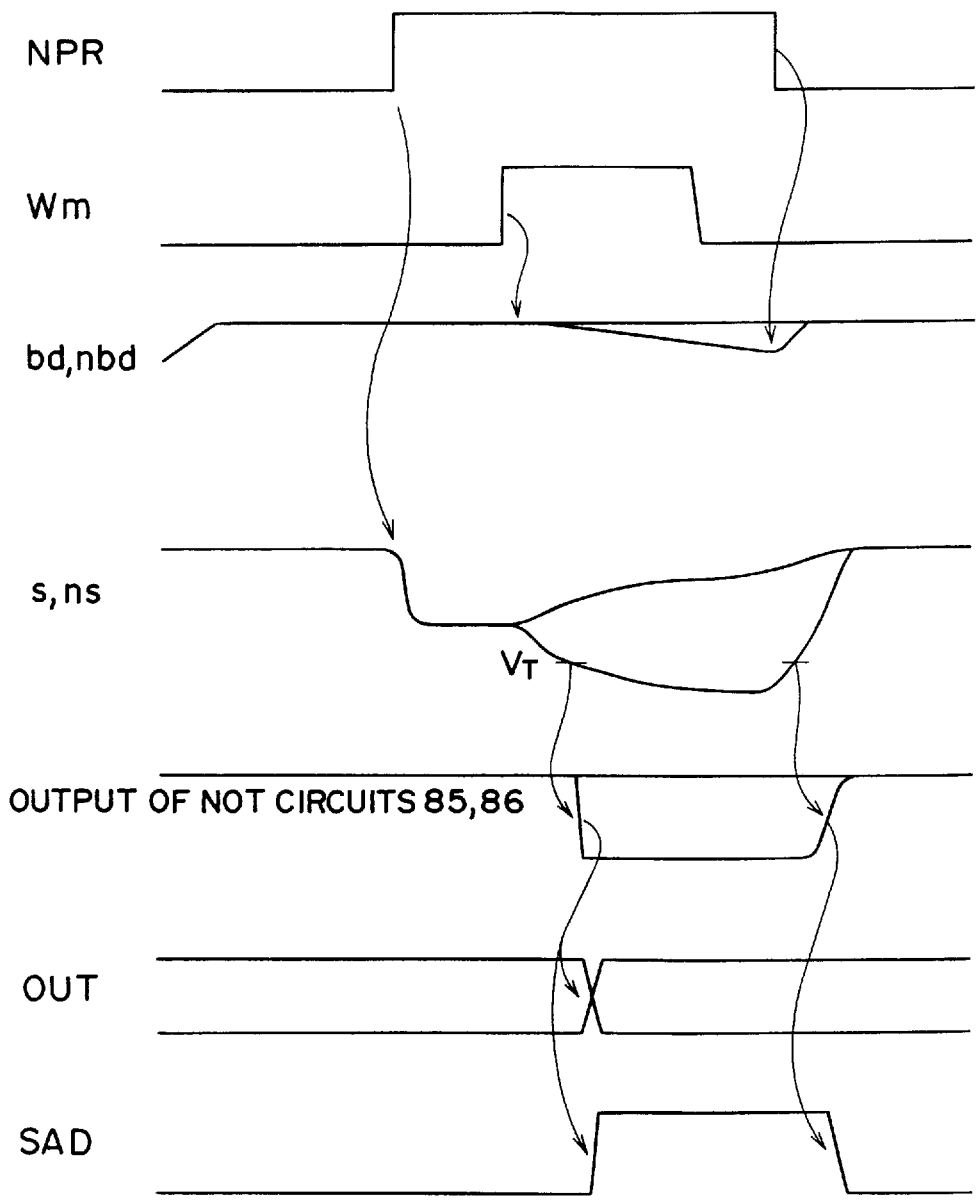
FIG. 7 is a timing chart of the operation shown in FIG. 6.

Next, the data reading operation illustrated in FIG. 6 will be hereinafter described. FIG. 7 is an operational timing chart of the circuit shown in FIG. 6. In the pre-charge state in which the pre-charge signal NPR is "0", the logical level of all the word lines $W_m$ is in a state of "0". Each electric potential of the bit lines bd and nbd is pre-charged to the power source potential VDD by PMOS 80 through 82, the sensing amplifier 6 is in a non-operating state, and output terminals s and ns of the sensing amplifier 6 are pulled up to the power source potential VDD. At this time, since each input of the NOT circuits 83 and 84 is held at the power source potential VDD, each output of the NOT circuits 85 and 86 is held at "1" and the reading operation signal SAD is maintained at "0". Further, the output latch circuit 9 still maintains the previous logical level. All the above is the operation at the time of pre-charge, namely, a waiting state for the memory reading operation.

Next, when the logical level of the pre-charge signal NPR changes to "1", namely, the memory discharge operation begins, in the sensing amplifier 6, NMOS 62 conducts to form a current path between PMOS 63, 64, NMOS 65, 66, and NMOS 62, and an amplifying operation of the sensing amplifier 6 starts. As shown in FIG. 7, the output terminals s and ns of the sensing amplifier 6 fall to a half or thereabouts of the power source potential VDD. At this time, one word line among the word lines $W_0$ through $W_{255}$, for example, the word line $W_0$ becomes "1", the memory cell $M_0$ is selected and the logical level of the contents stored in the memory cell $M_0$ is outputted to the bit lines bd and nbd.

For example, in a case in which the stored data of the selected memory cell $M_0$ is "1", the word line $W_0$ becomes "1", and the bit line nbd gradually undergoes a transition to a low level by the data held in the memory cell $M_0$ and the bit line bd maintains a state of being held at the power source potential VDD. At this time, PMOS 80 through 82 are set in a non-conductive state, and therefore, only the input terminal nbd of the sensing amplifier 6 decreases to a low level, the output terminal s of the sensing amplifier 6 further decreases from the level which is a half of VDD, and the output terminal ns is about to increase from the level which is a half of VDD. Since each threshold value of the NOT circuits 83 and 84 is set to be lower than the level which is a half of VDD, output of the NOT circuit 83 increases to a high level. Output of the NOT circuit 84 remains unchanged at the low level. At this time, the NOT circuit 85 outputs "0" and the NOT circuit 86 outputs "1". As a result, output of the NAND circuit 90 becomes "1" so that "1" is outputted from the output terminal OUT. Further, at this time, output of the NAND circuit 70 changes to "1".

Next, when the word line $W_0$ becomes "0", the memory cell $M_0$ closes and the pre-charge signal NPR becomes "0", the bit lines bd and nbd are pre-charged to the power source potential VDD, and at the same time, the output terminals s and ns of the sensing amplifier 6 each increase to the power source potential VDD and each output of the NOT circuits 85 and 86 becomes "1". Further, the reading operation signal SAD returns to "0". At this time, the bit output terminal OUT keeps outputting "1".

In a case in which the stored contents of the memory cell $M_0$ is "0", when the logical level of the pre-charge signal NPR is brought into the discharge state ("1") from the waiting state ("0"), the bit line bd is pulled into the low level and the bit line nbd is about to hold the power source potential VDD. At this time, since PMOS 80 through 82 are set in a non-conductive state, only the input terminal bd of the sensing amplifier 6 falls to the low level, the output terminal ns of the sensing amplifier 6 further falls from the level which is a half of VDD, and the output terminal s is about to increase from the level which is a half of VDD. As a result, the NOT circuits 85 and 86 output "1" and "0", respectively, output of the NAND circuit 91 becomes "1", and the bit output terminal OUT outputs "0". Further, at this time, output of the NAND circuit 70 changes to "1".

In other words, in the discharge state, the stored contents of the memory cell $M_0$ is read out, amplified by the sensing amplifier 6, detected by the NOT circuits 83 through 86, converted to a single output by the output latch circuit 9, and outputted as data read from the bit output terminal OUT. Further, the NAND circuit 70 outputs the reading operation signal SAD which becomes "1" during a reshaping operation of the sensing amplifier 6.

Figure 8:
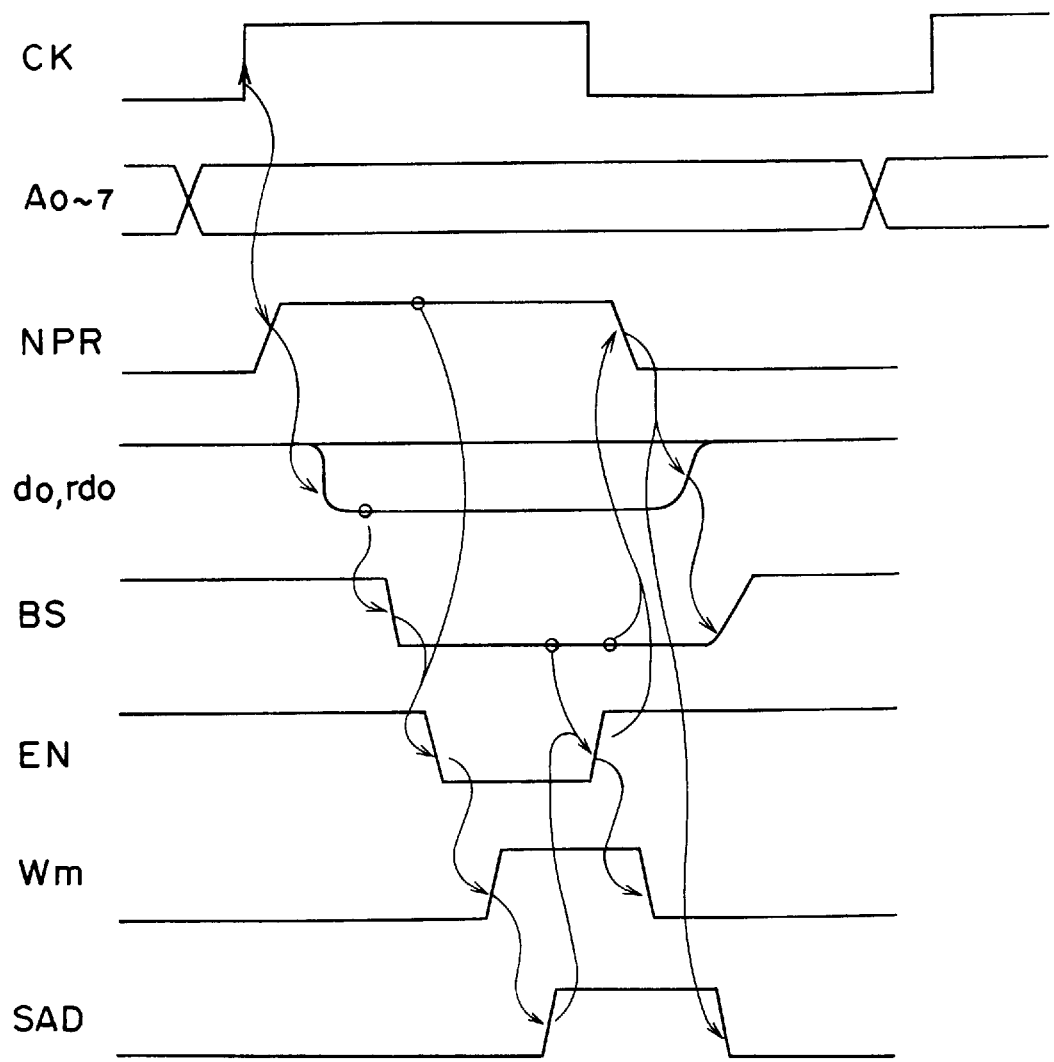
FIG. 8 is an operational timing chart of the address decoder of the first embodiment.

Next, the operation of the address decoder shown in FIG. 1 will be described. FIG. 8 is an operational timing chart of the address decoder shown in FIG. 1. In the memory module of the present invention, reading or writing of data is executed and completed within one cycle of the clock signal CK. Note that only description of data reading operation will be described below and a description of data writing operation will be omitted (in FIGS. 1 and 6, a circuit with regard to the writing operation is not illustrated). The data writing operation is merely different from the data reading operation in the means for generating a signal corresponding to the reading operation signal SAD in the reading operation, and other operations are all the same between the data reading operation and the data writing operation.

In the waiting state (pre-charge state), the pre-charge signal NPR and the enable signal EN, which are generated in the control circuit 1, are "0" and "1" respectively. The reading operation signal SAD generated by the NAND circuit 70 shown in FIG. 6 is "0" and the detection signal BS generated by the detection circuit 3 is "1". At this time, the drive signals $d_0$ through $d_7$ and $rd_0$ through $rd_7$ outputted from the address driver 2 are all "1" irrespective of the address signals $A_0$ through $A_7$.

When the externally inputted function selecting signal SEL becomes "1" and the module operation becomes necessary, the control circuit 1 latches the function selecting signal SEL at the rising edge of the clock signal CK so that the pre-charge signal NPR is changed to "1" to be brought into the discharge state. Further, the address driver 2 latches the address signals $A_0$ through $A_7$ at the rising edge of the clock signal CK, and when the drive signal $d_n$ and $rd_n$ corresponding to the address signal $A_n$ is brought into an enabled state due to the pre-charge signal NPR changing to "1", the positive phase of latch output of the address signal $A_n$ is outputted as the drive signal $d_n$ and the negative phase of the latch output of the address signal $A_n$ is outputted as the drive signal $rd_n$.

In FIG. 4, with the reading operation signal SAD being set to "0", output of the OR circuit 109 being "1", and output of the OR circuit 107 being "1", even when the pre-charge signal NPR changes to "1", the detection signal BS is "1" and output of the NOT circuit 108 is "0". Accordingly, the state of the SR latch circuit consisting of the NAND circuits 102 and 103 does not change and the enable signal EN is held at "1".

When either one of the drive signals $d_0$ and $rd_0$ from the address driver 2 becomes "0", the detection circuit 3 positioned farmost from the address decoder 2 detects the arrival of the drive signal so as to change the detection signal BS to "0", and the detection signal of "0" is inputted to the control circuit 1, in FIG. 4, output of the NOT circuit 108 changes to "1" and two inputs of the NAND circuit 106 both become "1". For this reason, output of the NAND circuit 106 changes to "0", output of the NAND circuit 102 changes to "1", three inputs of the NAND circuit 103 all become "1", and the enable signal EN outputted from NAND circuit 103 changes to "0".

Due to the change of the enable signal EN to "0", the decoding operation of the decoding circuit row i is permitted, "1" is outputted to the word line $W_m$ corresponding to the one decoding circuit $i_m$ among the decoding circuits $i_0$ through $i_{255}$. As a result, the memory cell $M_m$ indicated by address data consisting of the address signals $A_0$ through $A_7$ is selected.

Subsequently, when the reading operation signal SAD changes to "1" by the NAND circuit 70 and the reading operation signal SAD of "1" is inputted to the control circuit 1, in FIG. 4, output of the NOT circuit 104 changes from "1" to "0" and output of the OR circuit 107 changes to "0", and therefore, the enable signal EN returns to "1".

When the enable signal EN returns to "1" as described above, the decoding circuit row i is released from an enabled state and the selected word line $W_m$ returns to "0". Further, the enable signal EN, the reading operation signal SAD, and the pre-charge signal NPR all become "1". For this reason, output of the AND circuit 105 shown in FIG. 4 becomes "1", output of the F/F circuit 100 is forcibly restored to "0", and the pre-charge signal NPR returns to "0" to be restored to the pre-charge state. Meanwhile, output of the AND circuit 105 also returns to "0" concurrently with the pre-charge signal NPR returning to "0".

When the pre-charge signal NPR returns to "0" as described above, the drive signals $d_n$ and $rd_n$ are each forcibly set to "1" by the address driver 2, and the detection signal BS of the detection circuit 3 also returns to "1" accordingly. Further, the reading operation signal SAD also returns to "0". As a result, a series of decoding operation at the time of data reading process is completed.

As described above, according to the first embodiment, either one of signal lines of each drive signal pair reliably changes to "0", the signal delay time of each drive signal line with respect to the wiring length is equal, and the change of the drive signal at a position farmost from the address driver 2 is considered to be made slower than the change of a signal in the decoding circuits $i_0$ through $i_{255}$. For this reason, determination of the drive signals $d_0$ through $d_7$ and $rd_0$ through $rd_7$ in the decoding circuits $i_0$ through $i_{255}$ can be detected in such a manner that a drive signal line pair $d_0$ and $rd_0$ among the drive signal line pairs is connected to the detection circuit 3 at an end portion of each of the signal lines, which is opposite to the address driver 2 and the change of the logical level of either one signal line of the signal line pair is monitored. Accordingly, the decoding operation is executed in such a manner that the change of the above drive signal line to "0" is detected, the detection signal BS outputted from the detection circuit 3 is received, and the enable signal EN is changed to "0" by the control circuit 1 so as to determine the logical levels of the input drive signals of 256 decoding circuits before executing the decoding operation. As a result, it is possible to maintain the set-up time so as to prevent occurrence of a malfunction of the module.

The series of operations in the first embodiment are constructed such that the address decoder is actuated at the rising edge of the clock signal CK, executed in asynchronous manner up to completion of the cycle, and is not affected by variation of the delay time of the input drive signals in each decoding circuit, and also the decoding operation starts immediately after determination of the input drive signal. For this reason, a high-speed operation can be effected.

Further, it suffices that a simple circuit as shown in FIG. 3 may be used as the detection circuit 3. Accordingly, there is almost no possibility that a layout area increases due to provision of the detection circuit 3, and a layout area having substantially the same area as that of a conventional system will be sufficient.

In the above-described first embodiment, the direction and wiring length of the drive signal lines are made uniform and the wiring capacity and wiring resistance are all the same. However, these conditions are not necessarily required. For example, the drive signal line pair which is regarded as that having the maximum signal delay time may be monitored by the detection circuit 3. Further, in the above-described first embodiment, the logical level of the drive signal in the pre-charge state is set to "1", but the logical level of the drive signal in the pre-charge state may be set to "0" and the logical level detected by the detection circuit 3 may be set to "1".

[Second Embodiment]

Figure 9:
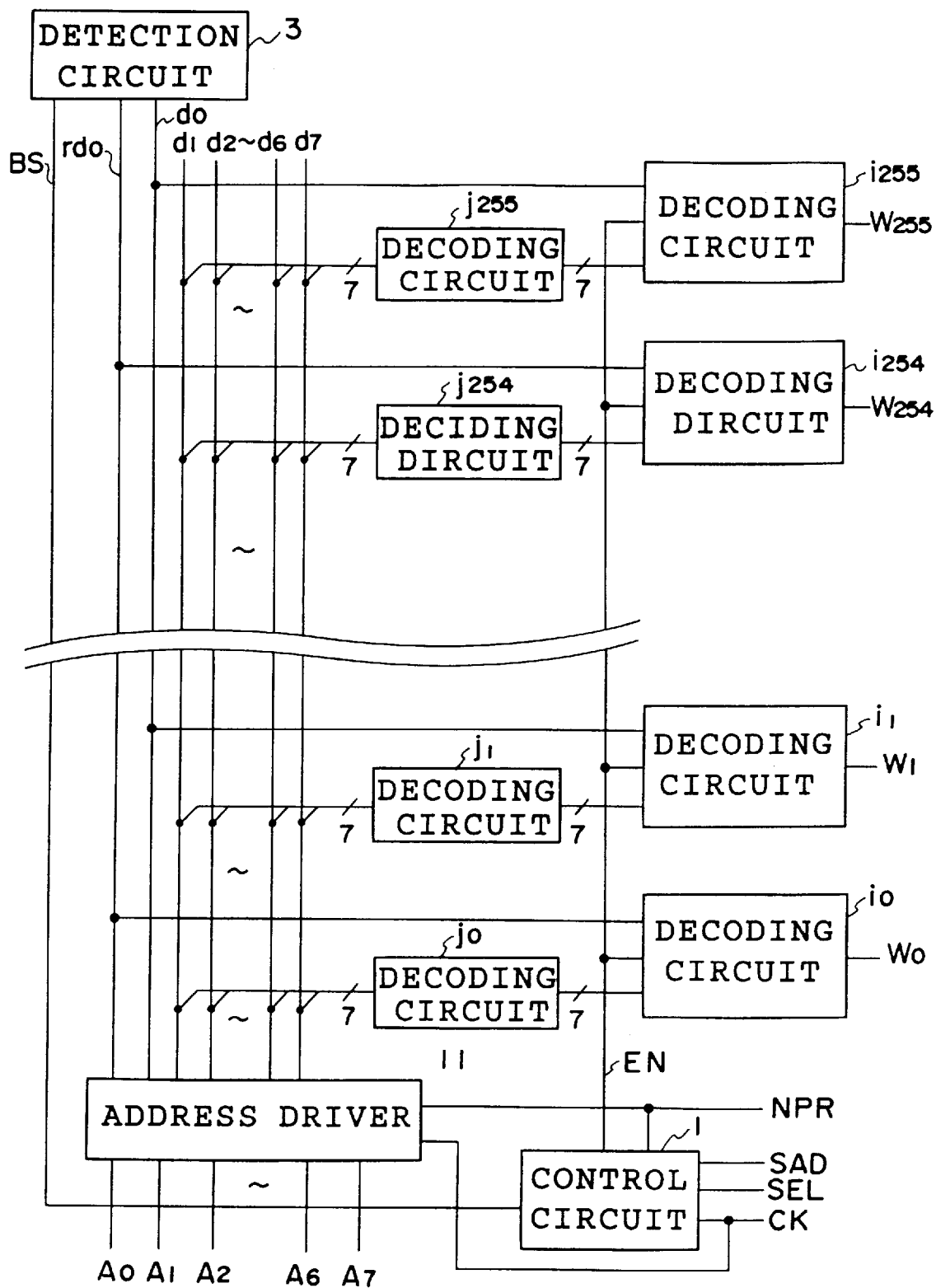
FIG. 9 is a circuit diagram which shows an address decoder according to a second embodiment of the present invention.

FIG. 9 is a circuit diagram which shows an address decoder according to a second embodiment of the present invention, the address decoder being provided in a synchronous high-speed SRAM module. The address decoder includes a control circuit 1, an address driver 11, a first decoding circuit row j consisting of 256 first decoding circuits $j_0$ through $j_{255}$, a second decoding circuit row i consisting of 256 second decoding circuits $i_0$ through $i_{255}$, and a detection circuit 3. Further, the above-described SRAM module has a memory cell array consisting of 256 words.

Meanwhile, the structure and function of the detection circuit 3 of the second embodiment are the same as those of the detection circuit 3 of the first embodiment (of which structural example is shown in FIG. 3). The detection circuit 3 of the second embodiment also inputs a pair of drive signal lines $d_0$ and $rd_0$ extended from the address driver 11. In the integrated circuit layout, in the same way as in the first embodiment, the detection circuit 3 is connected to the drive signal lines $d_0$ and $rd_0$ at end portions of the drive signal lines which are opposite to the address driver 11. Further, the structure and function of the second decoding circuits $i_m$ (m=0, 1 . . . 255) are the same as those of the decoding circuit $i_m$ (its structural example is shown in FIG. 5) of the first embodiment. Output of the second decoding circuit $i_m$ is connected to the word line $W_m$. In the integrated circuit layout, the second decoding circuits $i_0$ through $i_{255}$ are, in the same way as in the first embodiment, arranged uniformly so that the decoding circuit $i_0$ is located nearest to the address driver 11 and the decoding circuit $i_{255}$ is located farmost from the address driver 11. Further, the structure and function of the control circuit 1 are the same as those of the control circuit 1 of the first embodiment (its structural example is shown in FIG. 4). Moreover, in the same way as in the first embodiment, the drive signal lines to be monitored by the detection circuit 3 are not limited to the signal lines of the drive signals $d_0$ and $rd_0$, and for example, the signal lines of the drive signal $d_1$ and $rd_1$ may be used, or a plurality of drive signal pairs may be monitored.

The address driver 11 generates, from eight input address signals $A_0$ through $A_7$, nine drive signals $d_0$ through $d_7$, and $rd_0$ which become signals to be inputted to the first decoding circuit row j and the second decoding circuit row i, and outputs these drive signals to separate drive signal lines. A positive-phase drive signal $d_0$ and a negative-phase drive signal $rd_0$ each output "1" in the pre-charge state, and in the discharge state, latch and output positive-phase and negative-phase logical levels of the address signal $A_0$. Further, the positive-phase drive signals $d_1$ through $d_7$ latch and output the positive-phase logical levels of the address signals $A_1$ through $A_7$ irrespective of the pre-charge or discharge state.

Figure 10:
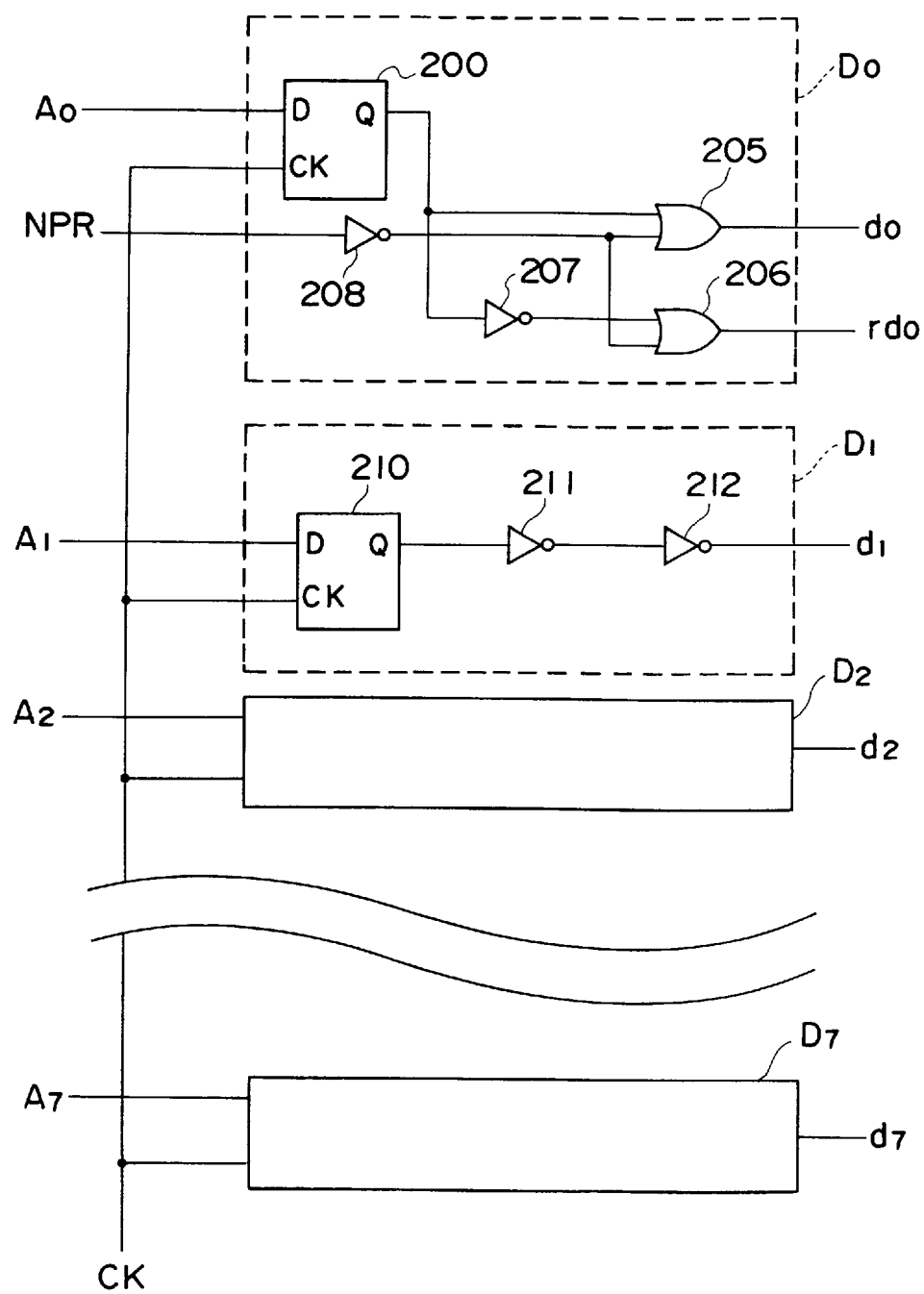
FIG. 10 is a circuit diagram which shows a structural example of an address driver in the address decoder of the second embodiment.

FIG. 10 is a circuit diagram which shows a structural example of the address driver 11. In this figure, among driving circuits $D_0$ through $D_7$ provided to respectively correspond to eight address signals $A_0$ through $A_7$, only the circuit structure of the driving circuit $D_0$ is different from those of other driving circuits and other drive circuits $D_1$ through $D_7$ have the same circuit structure. The circuit structure and function of the driving circuit $D_0$ are the same as those the driving circuit $D_n$ (n=0, 1 . . . 7) of the address driver 2 of the first embodiment shown in FIG. 2.

In the driving circuits $D_1$ through $D_7$ provided to respectively correspond to the address signals $A_1$ through $A_7$, the F/F circuit 210 is constructed such that the address signal $A_n$ is connected to a D input terminal thereof and the clock signal CK to a clock input terminal CK thereof, and the F/F circuit 210 latches the logical level of the address signal $A_n$ due to rising of the clock signal CK. Output of the F/F circuit 210 is connected to an input terminal of a NOT circuit 211, output of the NOT circuit 211 is connected to an input terminal of a NOT circuit 212 having sufficient driving capability, and output of the NOT circuit 212 forms an output terminal of the drive signal $d_n$ corresponding to the address signal $A_n$.

The first decoding circuit row j is a circuit which generates, by a first decoding circuit $j_m$ provided to correspond to a second decoding circuit $i_m$, separate drive signals $d_{m1}$ through $d_{m7}$ supplied from the drive signals $d_1$ through $d_7$ inputted from the address driver 11 to the second decoding circuit $i_m$. The first decoding circuits $j_0$ through $j_{255}$ have a similar structure. In the integrated circuit layout, the first decoding circuit $j_m$ is disposed close to the second decoding circuit $i_m$. Further, the input terminals $J_1$ through $J_7$ of the first decoding circuit $j_m$ are connected to the drive signals $d_1$ through $d_7$, and the separate drive signals $d_{m1}$ through $d_{m7}$ generated from the inputted drive signals $d_n$ are outputted to the input terminals $I_1$ through $I_7$ of the second decoding circuit $i_m$.

The input terminal $I_0$ of the second decoding circuit $i_m$ is connected to either one of the drive signal $d_0$ and the drive signal $rd_0$. The drive signal $rd_0$ is connected to the input terminal $I_0$ of the decoding circuit $i_0$ and the drive signal $d_0$ is connected to the input terminal $I_0$ of the decoding circuit $i_1$. Namely, the drive signal $rd_0$ is connected to the input terminal $I_0$ of a second decoding circuit $i_m$ (m is an even number) and the drive signal $d_0$ is connected to the input terminal $I_0$ of a second decoding circuit $i_m$ (m is an odd number).

Figure 11A:
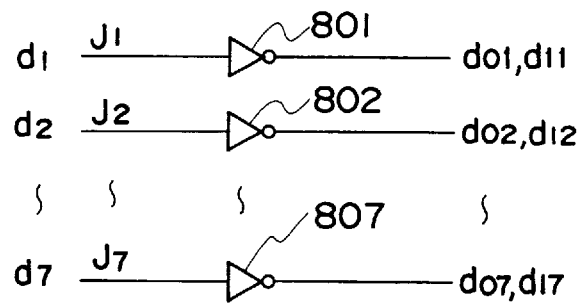
FIGS. 11A and 11B are circuit diagrams each showing a structural example of a first decoding circuit in the address decoder of the second embodiment.
Figure 11B:
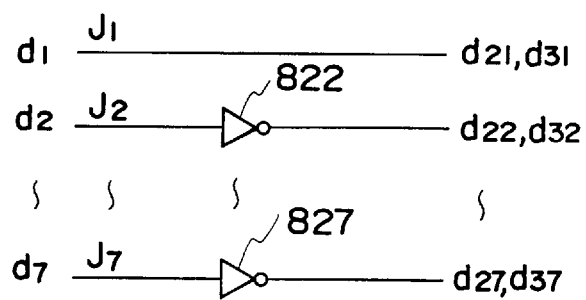

FIGS. 11A and 11B are circuit diagrams each showing a structural example of the first decoding circuit $j_m$: FIG. 11A is a circuit diagram of the first decoding circuits $j_0$ and $j_1$; and FIG. 11B is a circuit diagram of the first decoding circuits $j_2$ and $j_3$. The first decoding circuit $j_m$ is provided to output, as separate drive signals $d_{m1}$ through $d_{m7}$, the logical level which is the same as or opposite to that of the drive signals $d_1$ to $d_7$ in accordance with the numerical value of "m". As shown in FIG. 11A, the decoding circuits $j_0$, $j_1$ are provided with NOT circuits 801 through 807 respectively corresponding to the drive signals $d_1$ through $d_7$ and separate drive signals $d_{01}$ through $d_{07}$ and $d_{11}$ through $d_{17}$ have a logical level whose phase is opposite to that of the logical level of the drive signals $d_1$ through $d_7$. Further, as shown in FIG. 11B, the decoding circuits $j_2$, $j_3$ are provided with NOT circuits 822 through 827 respectively corresponding to the drive signals $d_2$ through $d_7$. Separate drive signals $d_{21}$, $d_{31}$ each have a logical level whose phase is the same as that of the logical level of the drive signal $d_1$ and other separate drive signals $d_{22}$ through $d_{27}$ and $d_{32}$ through $d_{37}$ have a logical level whose phase is opposite to that of the logical level of the drive signals of $d_2$ through $d_7$.

When data consisting of the address signals $A_7$ through $A_0$ is "00000000", the first decoding circuit $j_0$ and the second decoding circuit $i_0$ output "1" to the word line $W_0$ of the 0-th address and selects the word line $W_0$. Further, when data consisting of the address signals $A_7$ through $A_0$ is "00000001", the first decoding circuit $j_1$ and the second decoding circuit $i_1$ each "1" to the word line $W_1$ of the 1-st address and selects the word line $W_1$. Namely, data identical to that consisting of the same address signals $A_7$ through $A_0$ is inputted both to the input terminals $I_0$ through $I_7$ of the second decoding circuit im and to the input terminals $I_0$ through $I_7$ of the decoding circuit im of the first embodiment. Namely, the first decoding circuit row j and the second decoding circuit row i select the word line $W_m$ of the m-th address for the data consisting of the address signals $A_7$ through $A_0$ which indicate the m-th address. Accordingly, the first decoding circuit jm is provided with NOT circuits so that the separate drive signals $dm_1$ through $dm_7$ become identical to the input terminals $I_1$ through $I_7$ of the decoding circuit $i_m$ of the first embodiment with respect to the data consisting of the same address signals $A_7$ through $A_0$.

256 word lines $W_0$ through $W_{255}$ are respectively connected to corresponding words within the memory cell array. The address driver 11, the first decoding circuit row j and the second decoding circuit row i select a word (address space) designated by the address signals $A_0$ through $A_7$ by setting the logical level of the word line corresponding to the word to "1".

In FIG. 9, the first decoding circuits jm are slightly different from one another depending upon the numerical value of "m", but generally have the similar circuit structure. Further, the second decoding circuits im also have the same circuit structure. The first decoding circuit $j_m$ and the second decoding circuit $i_m$ are each provided such that as the numerical value of "m" becomes larger, the decoding circuit is disposed farther from the address driver 11. Namely, the decoding circuits $j_0$ and $i_0$ are disposed in the vicinities of the address driver 11 and the decoding circuits $j_{255}$ and $i_{255}$ are disposed farmost from the address driver 11.

The signal lines of the drive signals $d_0$, $rd_0$ and $d_1$ through $d_7$ are disposed in parallel with the positions of the decoding circuits $j_m$ and $i_m$, and also arranged in such a manner as to be parallel with one another. The wires forming the signal lines have the same materials and the same line width. This means that wiring capacity and wiring resistance contained in each drive signal line are each the same between the drive signal lines, namely, a delaying factor for transmission of an electric signal resides uniformly in each drive signal line. Further, the distance between the drive signal lines extended from respective output terminals of the address driver 11 and the respective contact points of the input terminals $j_1$ through $j_7$ of the decoding circuit $j_m$ and the input terminal $I_0$ of the decoding circuit $i_m$ is substantially equal and the phase difference between the drive signals inputted to the decoding circuits $j_m$ and $i_m$ can be thereby ignored.

Next, the decode operation of the address decoder shown in FIG. 9 will be described. In the SRAM module of the present invention, reading and writing of data is executed and completed within one cycle of the clock signal CK. Note that an operational timing chart of the address decoder shown in FIG. 9 is the same as that of the address decoder of the first embodiment, which is shown in FIG. 8. Only a decoding operation during reading of data will be described below. A decoding operation during writing of data is the same as that during reading of data except that other signal corresponding to the reading operation signal SAD is inputted, and therefore, a description thereof will be omitted.

In the waiting state in which the function selecting signal SEL is "0", the pre-charge signal NPR is "0", the enable signal EN is "1", the reading operation signal SAD is "0", and the detection signal BS is "1". Further, the drive signals $d_0$ and $rd_0$ each output the logical level of "1" irrespective of the address signal $A_0$ and the drive signals $d_1$ through $d_7$ output the logical level of previous latch data of the address signals $A_1$ through $A_7$.

When the function selecting signal SEL becomes "1", the pre-charge signal NPR changes to "1" at the rising edge of the clock signal CK to be brought into the discharge state. Further, the address driver 11 latches the address signals $A_0$ through $A_7$ at the rising edge of the clock signal CK, and immediately outputs, as the drive signals $d_1$ through $d_7$, a positive-phase logical level of latch output of the address signals $A_1$ through $A_7$. Further, when the change of the pre-charge signal NPR causes the drive signals $d_0$ and $rd_0$ corresponding to the address signal $A_0$ to be enabled, the positive-phase and negative-phase logical levels of the latch output of the address signal $A_0$ are outputted as the drive signals $d_0$ and $rd_0$, respectively. The above-described drive signals $d_1$ through $d_7$ are respectively inputted to the first decoding circuits $j_0$ through $j_{255}$ and the first decoding circuit $j_m$ generates separate drive signals $d_{m1}$ through $d_{m7}$ and outputs these drive signals to the second decoding circuit $i_m$. At this time, the enable signal EN is in a state of being held at "1".

Subsequently, when the drive signal $d_0$ or $rd_0$ changes to "0", the detection circuit 3 positioned farmost from the address driver 11 detects the arrival of this drive signal and drives a detection signal BS to "0", and the detection signal BS is inputted to the control circuit 1, the control circuit 1 changes the enable signal EN to "0". When the enable signal EN changes to "0", the second decoding circuit row i is enabled, the one second decoding circuit $i_m$ outputs the logical level "1" to the word line $W_m$, and the memory cell $M_m$ indicated by input address data is selected.

When the data reading operation is executed within the module in accordance with selection of the memory cell $M_m$ and the reading operation signal SAD changes to "1", the control circuit 1 returns the enable signal EN to "1", and therefore, an enabled state of the second decoding circuit row i is released and the selected word line $W_m$ returns to "0". Further, when the enable signal EN returns to "1", the control circuit 1 returns the pre-charge signal NPR to "0" to be brought back to the pre-charge state.

When the pre-charge signal NPR returns to "0", output of the address driver 11, i.e., the drive signals $d_0$ and $rd_0$ returns to "1", the detection signal BS also returns to "1", and the reading operation signal SAD also returns to "0". As a result, a series of decoding operation during reading of data is completed.

As described above, according to the second embodiment, either one of the drive signals $d_0$ and $rd_0$ reliably changes to "0", the signal delay time of each drive signal line with respect to the wiring length is equal, and the change of the drive signal $d_0$ or $rd_0$ at a position farmost from the address driver 11 is considered to be made slower than the change of the drive signal $d_0$ or $rd_0$ and that of the separate drive signals $d_{m1}$ through $d_{m7}$ in the second decoding circuit $i_m$. For this reason, determination of the drive signal $d_0$ or $rd_0$ and the separate drive signals in the second decoding circuits $i_0$ through $i_{255}$ can be detected in such a manner that the drive signal line pair $d_0$ and $rd_0$ is connected to the detection circuit 3 at an end portion of each of the drive signal lines, which is opposite to the address driver 11 and the change of the logical level of either one signal line of the signal line pair is monitored. Accordingly, the decoding operation is executed in such a manner that the change of the drive signal lines of the drive signals $d_0$ and $rd_0$ to "0" is detected, the detection signal BS outputted from the detection circuit 3 is received, and the enable signal EN is changed to "0" by the control circuit 1 so as to determine the logical levels of the input drive signals of the second decoding circuits $i_0$ through $i_{255}$ before executing the decoding operation. As a result, it is possible to maintain the set-up time so as to prevent occurrence of a malfunction of the module.

The series of operations in the second embodiment are constructed in that the address decoder is actuated at the rising edge of the clock signal CK, executed in asynchronous manner up to completion of the cycle, and is not affected by variation of the delay time of the input drive signals in each decoding circuit, and also the decoding operation starts immediately after determination of the input drive signal. For this reason, a high-speed operation can be effected.

Further, it suffices that a simple circuit as shown in FIG. 3 may be used as the detection circuit 3. Accordingly, there is almost no possibility that a layout area increases due to provision of the detection circuit 3, and a layout area having substantially the same area as that of a conventional system will be sufficient.

Moreover, a small number of drive signal lines suffices as compared with the first embodiment and the layout area determined by arrangement of these signal lines can thereby be reduced.

In the above-described second embodiment, the direction and wiring length of the drive signal lines are made uniform and the wiring capacity and wiring resistance are the same in these drive signal lines. However, these conditions are not necessarily required. For example, the drive signal line pair whose signal delay time becomes larger than that of the others may be monitored by the detection circuit 3. Further, in the above-described second embodiment, the logical level of the drive signal in the pre-charge state is set to "1", but the logical level of the drive signal in the pre-charge state may be set to "0" and the logical level detected by the detection circuit 3 may be set to "1".

[Third Embodiment]

Figure 12:
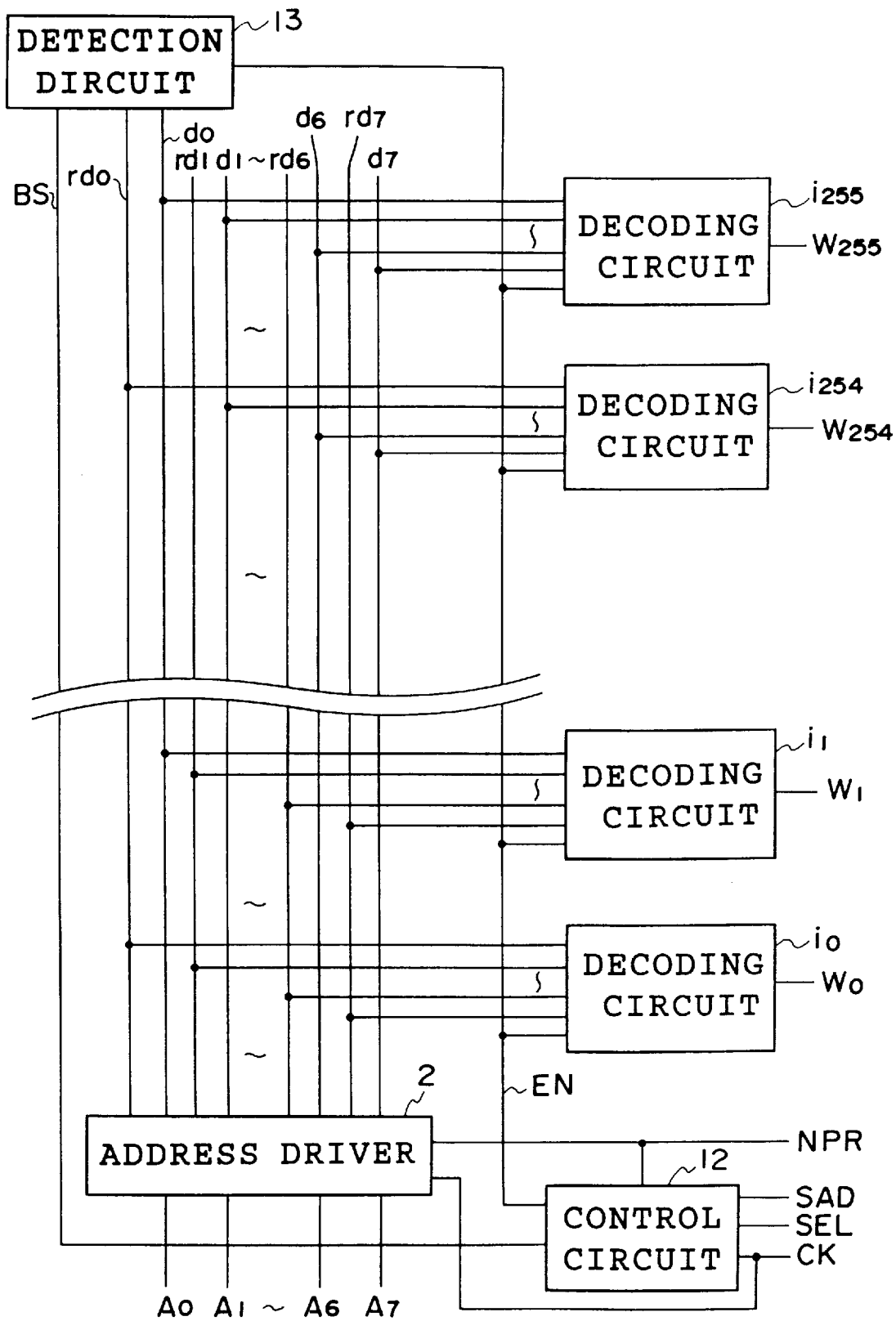
FIG. 12 is a circuit diagram which shows an address decoder according to a third embodiment of the present invention.

FIG. 12 is a circuit diagram which shows an address decoder according to a third embodiment of the present invention, the address decoder being provided in a synchronous high-speed SRAM module. The address decoder includes a control circuit 12, an address driver 2, a decoding circuit row i consisting of 256 decoding circuits $i_0$ through $i_{255}$, and a detection circuit 13. Further, the above-described SRAM module has a memory cell array consisting of 256 words.

The structure and function of the address driver 2 of the third embodiment are the same as those of the address driver 2 of the first embodiment (its structural example is shown in FIG. 2). The address driver 2 of the third embodiment generates, from eight input address signals $A_0$ through $A_7$, 16 drive signals $d_n$ and $rd_n$ which are set to the logical level "1" in the pre-charge state and which latch and output positive-phase and negative-phase logical levels of the address signals $A_n$ (n=0, 1 . . . 7) in the discharge state. Further, the structure and function of the decoding circuit $i_m$ of this embodiment (m=0, 1 . . . 255) are the same as those of the decoding circuit $i_m$ of the first embodiment (its structural example is shown in FIG. 5) and connection of the decoding circuit $i_m$ to the input terminal $I_n$ and to the drive signal $d_n$ or $rd_n$ is the same as that in the first embodiment shown in FIG. 1. Further, in the integrated circuit layout, the decoding circuits $i_0$ through $i_{255}$ are, in the same way as in the first embodiment, arranged uniformly so that the decoding circuit $i_0$ is positioned nearest to the address driver 2 and the decoding circuit $i_{255}$ is positioned farmost from the address driver 2.

The detection circuit 13 inputs a pair of drive signals $d_0$, $rd_0$ extended from the address driver 2, which respectively have positive-phase and negative-phase logical levels, and the enable signal EN from the control circuit 12, and monitors each logical level of the drive signals $d_0$, $rd_0$ and the enable signal EN. When the logical level of the enable signal is "1" and the detection circuit 13 detects that the logical level of either one of the drive signals is "0", the detection circuit 13 outputs a detection signal BS of "0" (corresponding to a first detection signal). Further, when the detection circuit 13 detects that the enable signal EN has changed to "0", it returns the detection signal BS to "1", and when the detection circuit 13 detects that the enable signal EN has returned to "1", the detection circuit 13 sets again the detection signal BS to "0" (corresponding to a second detection signal). In the integrated circuit layout, the detection circuit 13 is connected with the address driver 2 at an end of the signal lines of the drive signals $d_0$ through $d_7$ and $rd_0$ through $rd_7$ which are extended from the address driver 2 and disposed in parallel with the direction in which the decoding circuits $i_0$ through $i_{255}$ are arranged, in other words, at the end portion of the drive signal lines on the side opposite to the address driver 2. Further, the detection circuit 13 is connected with an enable signal line, on which the enable signal EN is outputted, at an end portion of the enable signal line on the side opposite to the control circuit 12. Note that the above pair of drive signals are not limited to the drive signals $d_0$ and $rd_0$, and for example, another pair of drive signals $d_1$ and $rd_1$ may be used or a plurality of drive signal pairs may be monitored.

Figure 13:
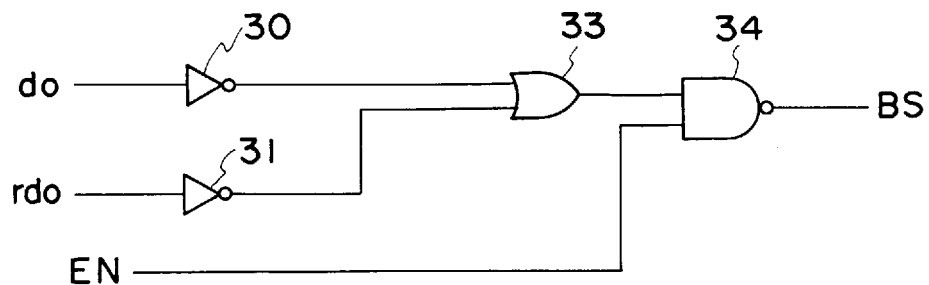
FIG. 13 is a circuit diagram which shows a structural example of a detection circuit in the address decoder of the third embodiment.

FIG. 13 is a circuit diagram which shows a structural example of the detection circuit 13. In this figure, the drive signals $d_0$ and $rd_0$ are respectively connected to input terminals of NOT circuits 30 and 31 and respective outputs of the NOT circuits 30 and 31 are connected to two input terminals of an OR circuit 33. Output of the OR circuit 33 is connected to a first input terminal of a NAND circuit 34. Further, the enable signal EN is connected to a second input terminal of the NAND circuit 34 and output of the NAND circuit 34 forms an output terminal of the detection signal BS.

For this reason, when either one of the drive signals $d_0$ and $rd_0$ is "0", either one of the two input terminals of the OR circuit 33 becomes "1", and when the enable signal EN is "1", the detection signal BS outputs "0". At this time, when the logical level of the enable signal EN is "0", the detection signal BS outputs "1" irrespective of each logical level of the drive signals $d_0$ and $rd_0$.

Subsequently, the control circuit 12 inputs an externally supplied clock signal CK, a function selecting signal SEL, a reading operation signal SAD from the module, and the detection signal BS from the detection circuit 13 and generates, from these input signals, the enable signal EN which permits or inhibits the operation of the decoding circuit row i and the pre-charge signal NPR which controls the reading operation of the module.

Figure 14:
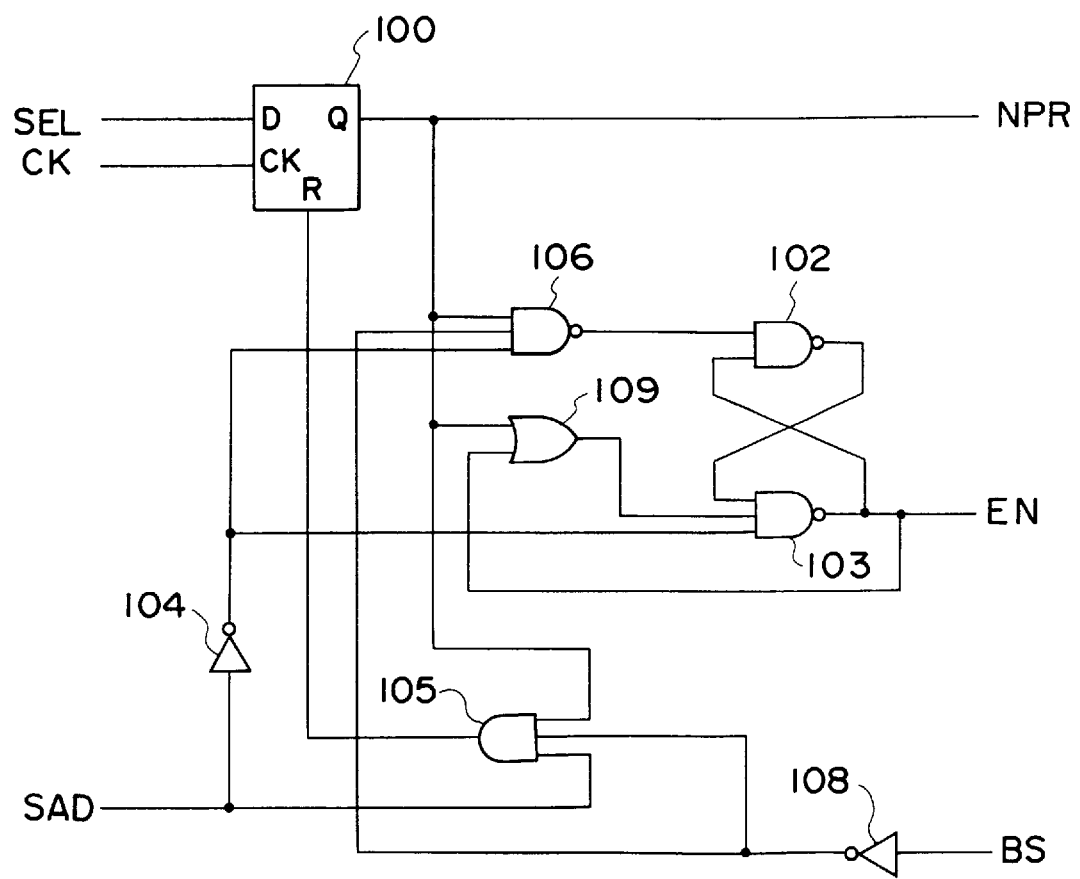
FIG. 14 is a circuit diagram which shows a structural example of a control circuit in the address decoder of the third embodiment.

FIG. 14 is a circuit diagram which shows a structural example of the control circuit 12. In this figure, F/F circuit 100 is constructed in that the function selecting signal SEL is connected to a D input terminal thereof and the clock signal CK is connected to a clock input terminal CK thereof. The F/F circuit 100 latches the function selecting signal SEL to generate the pre-charge signal NPR. The pre-charge signal NPR is connected to a first input terminal of a NAND circuit 106 and to a first input terminal of an AND circuit 105, and is also connected to a first input terminal of an OR circuit 109. The detection signal BS is connected to an input terminal of a NOT circuit 108 and output of the NOT circuit 108 is connected to a second input terminal of the NAND circuit 106 and to a second input terminal of the AND circuit 105. The reading operation signal SAD is connected to a third input terminal of the AND circuit 105 and to an input terminal of NOT circuit 104. Output of the NOT circuit 104 is connected to a third input terminal of the NAND circuit 106 and to a first input terminal of a NAND circuit 103. Output of the NAND circuit 106 is connected to a first input terminal of a NAND circuit 102, output of the NAND circuit 102 is connected to a second input terminal of the NAND circuit 103, and output of the OR circuit 109 is connected to a third input terminal of the NAND circuit 103. The output terminal of the NAND circuit 103 generates the enable signal EN and is connected to a second input terminal of the NAND circuit 102 and to a second input terminal of the OR circuit 109. Output of the AND circuit 105 is connected to a reset input terminal R of the F/F circuit 100.

Figure 15:
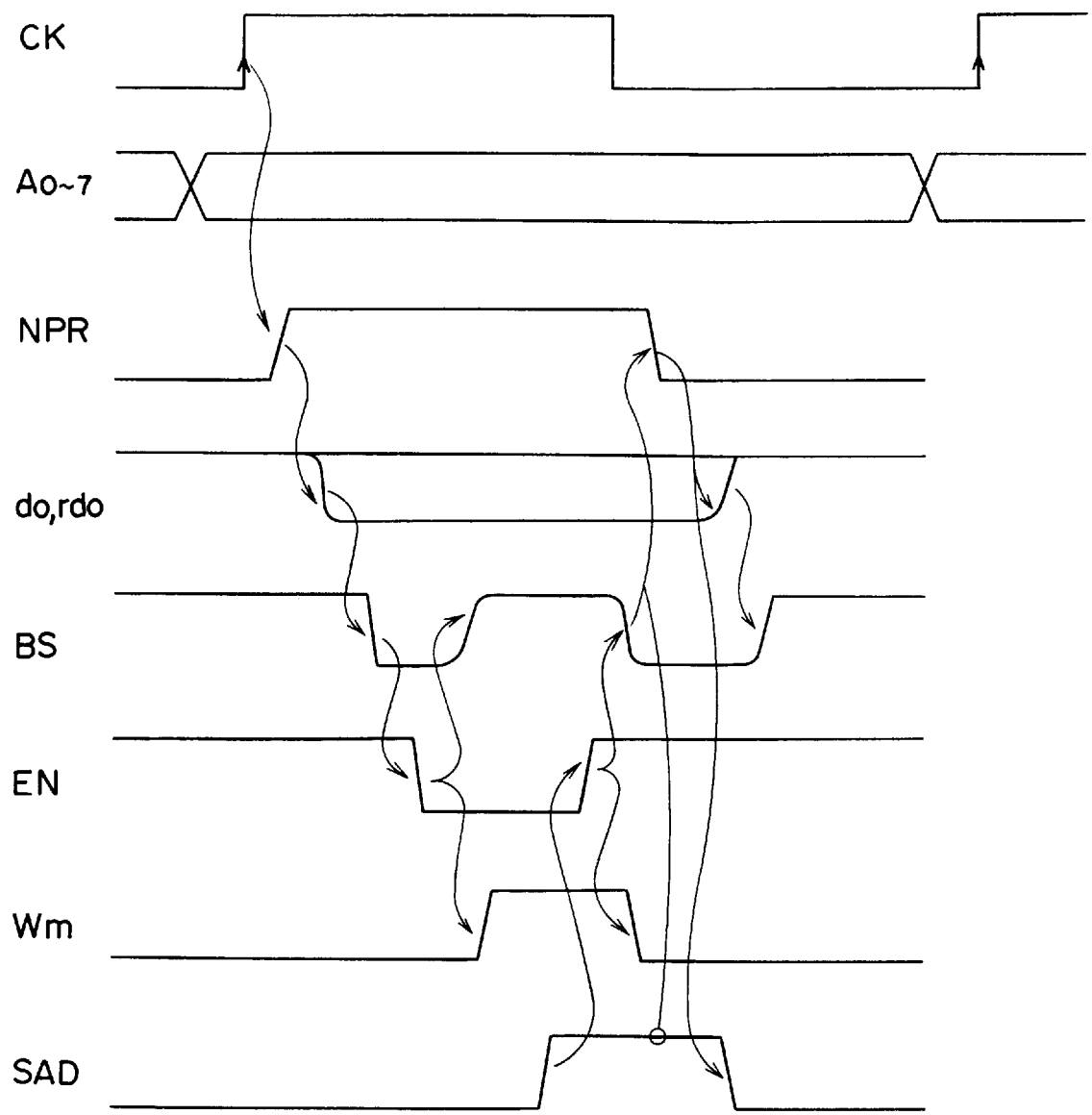
FIG. 15 is an operational timing chart of the address decoder of the third embodiment.

Next, the decoding operation of the address decoder shown in FIG. 12 will be described. In the SRAM module of the present invention, a reading or writing operation of data is executed and completed within one cycle of the clock signal CK. FIG. 15 is a timing chart of the operation of the address decoder shown in FIG. 12. Note that only the decoding operation at the time of data reading will be described herein, but the decoding operation at the time of data writing is effected in the same way as in the data reading except that other signal corresponding to the reading operation signal SAD is inputted.

In a waiting state in which the function selecting signal SEL has a logical level "0", the pre-charge signal NPR is "0", the enable signal EN is "1", the reading operation signal SAD is "0", and the detection signal BS is "1". Further, the drive signals $d_n$ and $rd_n$ each output "1" irrespective of the address signal $A_n$.

When the function selecting signal SEL becomes "1", the pre-charge signal NPR changes to "1" at the rising edge of the clock signal CK to be brought into the discharge state. Further, the address signal $A_n$ is latched at the rising edge of the clock signal CK, and when the drive signals $d_n$ and $rd_n$ are brought into an enabled state due to the change of the pre-charge signal to "1", the positive-phase logical level of the latch output of the address signal $A_n$ is outputted as the drive signal $d_n$ and the negative-phase logical level of the latch output of the address signal $A_n$ is outputted as the drive signal $rd_n$. At this time, in FIG. 14, even when the pre-charge signal NPR changes to "1" with the reading operation signal SAD being set at "0" and output of the OR circuit 109 being set at "1", the detection signal BS is "1" and output of NOT circuit 108 is "0". For this reason, the state of the SR latch circuit consisting of the NAND circuits 102 and 103 does not change and the enable signal EN remains in a state of being held at "1".

Subsequently, when either one of the drive signals $d_0$ and $rd_0$ changes to "0", the detection circuit 13 located farmost from the address driver 2 detects the arrival of this drive signal to drive a detection signal BS to "0", and the detection signal BS is inputted to the control circuit 13, in FIG. 14, output of the NOT circuit 108 changes to "1", three inputs of the NAND circuit 106 each become "1", and output of the NAND circuit 106 becomes "0". Accordingly, output of the NAND circuit 102 becomes "1", three inputs of the NAND circuit 103 all become "1", and the enable signal EN changes to "0".

When the logical level of the enable signal EN changes to "0", the decoding circuit row i is enabled, the one decoding circuit $i_m$ outputs the logical level of "1" to the word line $W_m$, and the memory cell $M_m$ indicated by the input address data is selected. Further, when the detection circuit 13 detects the arrival of the enable signal EN changed to "0", it returns the detection signal BS to "1". When the detection signal BS whose logical level is "1" is inputted to the control circuit 13, in FIG. 14, output of the NOT circuit 108 changes to "0". However, the reading operation signal SAD is "0" and output of the AND circuit 105 thereby remains unchanged to be held at "0". Further, a second input terminal of the NAND circuit 106 becomes "0" and output of the NAND circuit 106 becomes "1". However, the enable signal EN is "0", and therefore, output of the NAND circuit 102 remains unchanged to be held at "1".

Subsequently, when the data reading operation is executed within the module in accordance with the selection of the above memory cell $M_m$, the reading operation signal SAD changes to "1", and the reading operation signal SAD is inputted to the control circuit 12, in FIG. 14, output of the NOT circuit 104 becomes "0", and therefore, the enable signal EN outputted from the NAND circuit 103 returns to "1". When the enable signal EN returns to "1", an enabled state of the decoding circuit row i is released and the selected word line $W_m$ returns to "0". Further, when the detection circuit 13 positioned farmost from the control circuit 12 detects the arrival of the enable signal EN restored to "1", the detection signal BS is again driven to be "0". When the detection signal BS set at "0" is inputted to the control circuit 12, in FIG. 14, output of the NOT circuit 108 changes to "1". At this time, since the reading operation signal SAD is "1" and the pre-charge signal NPR is "1", output of the AND circuit 105 becomes "1" and the pre-charge signal NPR outputted from the F/F circuit 100 is forcibly restored to "0" to return to the pre-charge state. When the pre-charge signal NPR returns to "0", output of the AND circuit 105 shown in FIG. 14 also returns to "0".

When the pre-charge signal NPR returns to "0", the drive signals $d_n$ and $rd_n$ each return to "1", and therefore, the detection signal BS also returned to "1". Further, the reading operation signal SAD also returns to "0". As a result, a series of decoding operation during reading of data is completed.

As described above, according to the third embodiment, determination of the input drive signals in the decoding circuits $i_0$ through $i_{255}$ can be detected in such a manner that a drive signal line pair $d_0$ and $rd_0$ among the drive signal line pairs is connected to the detection circuit 13 at an end portion of each of the signal lines on the side opposite to the address driver 2 and the change of the logical level of either one signal line of the signal line pair is monitored. Accordingly, the decoding operation is executed in such a manner that the change of the above drive signal line to "0" is detected, the detection signal BS outputted from the detection circuit 3 is received, and the enable signal EN is changed to "0" by the control circuit 12 so as to determine the logical levels of the input drive signals of 256 decoding circuits before executing the decoding operation. As a result, it is possible to maintain the set-up time so as to prevent occurrence of a malfunction of the module.

Further, it suffices that a simple circuit as shown in FIG. 13 may be used as the detection circuit 13. Accordingly, there is almost no possibility that a layout area increases due to provision of the detection circuit 13, and a layout area having substantially the same area as that of a conventional system will be sufficient.

Further, a completion of a decode-enabled period in the decoding circuits $i_0$ through $i_{255}$ can be detected by the detection circuit 13 which is connected with the enable signal line at an end portion of the enable signal line on the side opposite to the control circuit 12 and monitors the change of the enable signal EN. Accordingly, when the detection circuit 13 detects that the enable signal EN has returned from "0" to "1", the control circuit 12 receives the detection signal BS outputted from the detection circuit 13 so as to return the pre-charge signal NPR from "1" to "0", 256 decoding circuits are reliably brought into the decode-disabled state, and thereafter return to the pre-charge state. As a result, it is possible to maintain a holding time of the drive signals with respect to the enable signal.

Further, a series of operations in the third embodiment is constructed such that the address decoder is actuated at the rising edge of the clock signal CK, executed in asynchronous manner up to completion of the cycle, and is not affected by a variation of the delay time of the input drive signals in each decoding circuit, and also the decoding operation starts immediately after determination of the input drive signal, and when the reading or writing operation of the module is completed, the decoding circuits are immediately brought into the pre-charge state with the hold time being maintained. For this reason, a high-speed operation without occurrence of malfunction can be effected.

In the above-described third embodiment, the direction and wiring length of the drive signal lines are made uniform and the wiring capacity and wiring resistance are the same in these drive signal lines. However, these conditions are not necessarily required. For example, the drive signal line pair which is regarded as that having the maximum signal delay time may be monitored by the detection circuit 13. Further, in the above-described third embodiment, the logical level of the drive signal in the pre-charge state is set to "1", but the logical level of the drive signal in the pre-charge state may be set to "0" and the logical level detected by the detection circuit 13 may be set to "1".

Further, there may be applied a structure in which the address driver outputs the drive signals $d_0$, $rd_0$ and $d_1$ through $d_7$, and the first and second decoding circuits j and i are provided as the decoding circuit row, in the same way as in the second embodiment.

[Fourth Embodiment]

Figure 16:
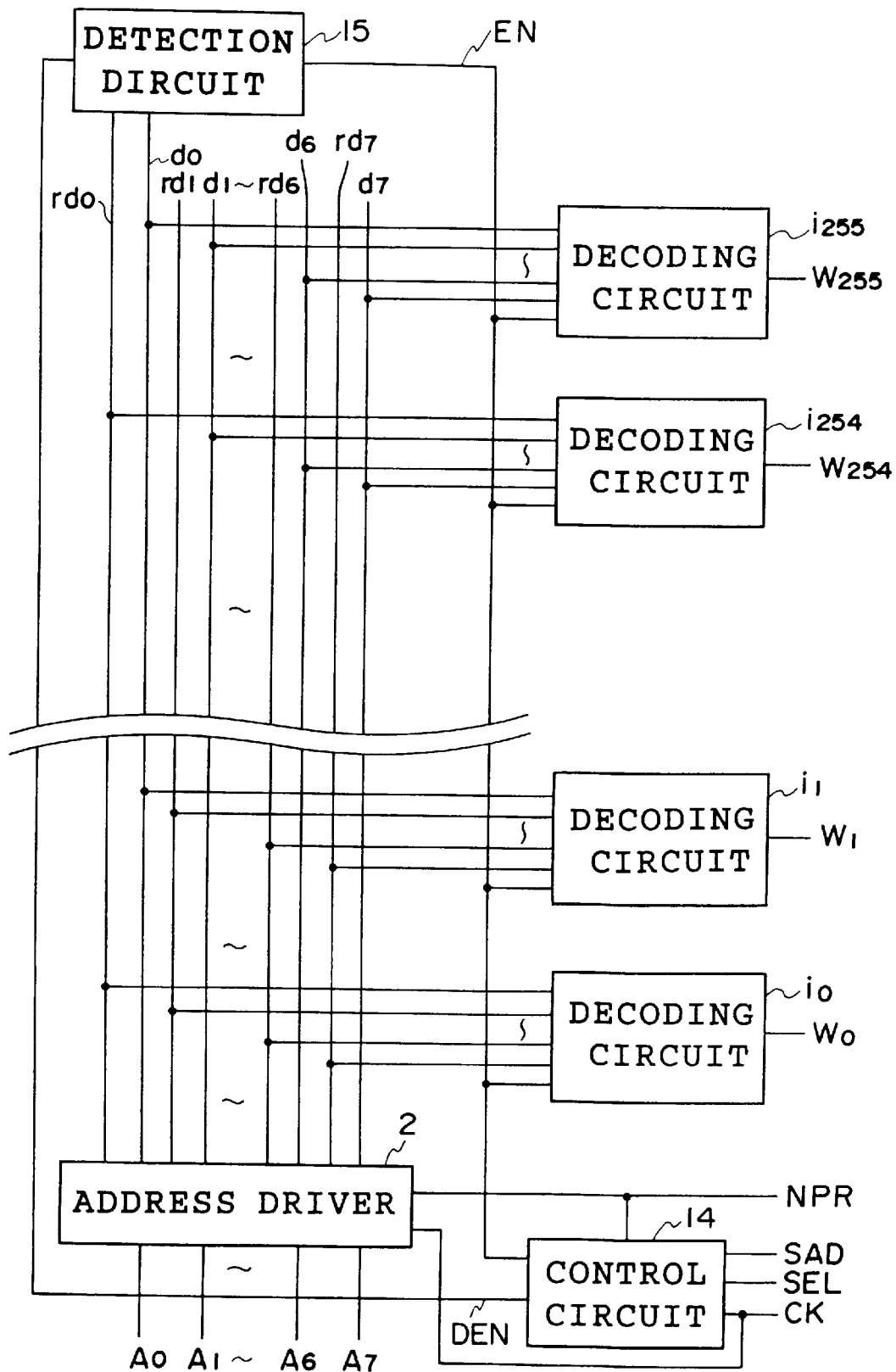
FIG. 16 is a circuit diagram which shows an address decoder according to a fourth embodiment of the present invention.

FIG. 16 is a circuit diagram which shows an address decoder according to a fourth embodiment of the present invention, the address decoder being provided in the synchronous high-speed SRAM module. The address decoder includes a control circuit 14, an address driver 2, a decoding circuit row i consisting of 256 decoding circuits $i_0$ through $i_{255}$, and a detection circuit 15. Further, the above SRAM module has a memory cell array consisting of 256 words.

The structure and function of the address driver 2 of the fourth embodiment are the same as those of the address driver 2 of the first embodiment (its structural example is shown in FIG. 2). The address driver 2 of the fourth embodiment generates, from eight input address signals $A_0$ through $A_7$, 16 drive signals $d_n$ and $rd_n$ which are set to the logical level "1" in the pre-charge state and which latch and output positive-phase and negative-phase logical levels of the address signals $A_n$ (n=0, 1 ... 7) in the discharge state. Further, the structure and function of the decoding circuit $i_m$ of this embodiment (m=0, 1 ... 255) are the same as those of the decoding circuit $i_m$ of the first embodiment (its structural example is shown in FIG. 5) and connection of the input terminal $I_n$ with the drive signal $d_n$ or $rd_n$ is the same as that in the first embodiment shown in FIG. 1. Further, in the integrated circuit layout, the decoding circuits $i_0$ through $i_{255}$ are, in the same way as in the first embodiment, arranged uniformly so that the decoding circuit $i_0$ is positioned nearest to the address driver 2 and the decoding circuit $i_{255}$ is positioned farmost from the address driver 2.

The detection circuit 15 inputs a pair of drive signals, for example, $d_0$ and $rd_0$ from the address driver 2, which have positive-phase and negative-phase logical levels, and a detection inhibiting signal DEN from the control circuit 14, and monitors each logical level of the drive signals $d_0$, $rd_0$, and also the detection inhibiting signal DEN, at a position farmost from the address driver 2 in the layout of the decoding circuits $i_0$ through $i_{255}$. When the detection circuit 15 detects that the logical level of either one of the drive signals is "0", it immediately starts to output the enable signal EN which permits or inhibits the operation of the decoding circuit row i. When the control circuit 14 starts to output the detection inhibiting signal DEN in accordance with output of the enable signal EN starting up, the output of the enable signal EN is stopped.

Figure 17:
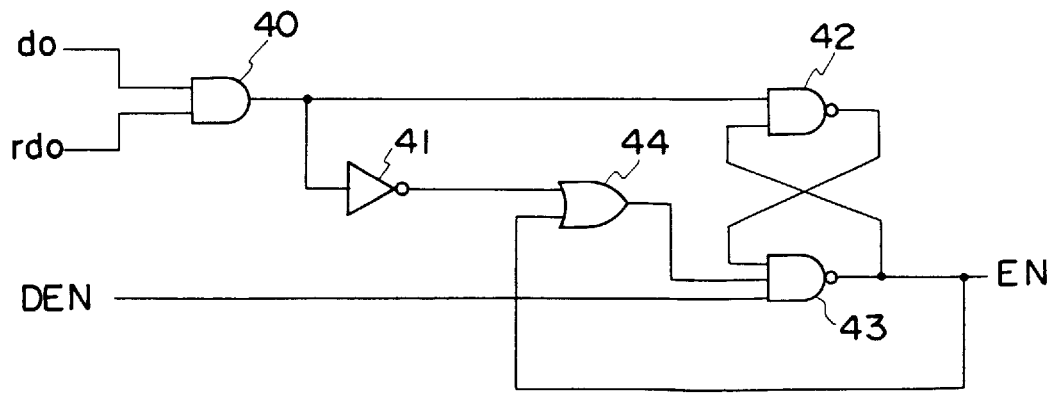
FIG. 17 is a circuit diagram which shows a structural example of a detection circuit in the address decoder of the fourth embodiment.

FIG. 17 is a circuit diagram which shows an example of the detection circuit 15. In this figure, the drive signals $d_0$ and $rd_0$ are respectively connected to first and second input terminals of an AND circuit 40, and output of the AND circuit 40 is connected to a first input terminal of a NAND circuit 42 and to an input terminal of a NOT circuit 41. Output of the NOT circuit 41 is connected to a first input terminal of an OR circuit 44. Output of the OR circuit 44 and the detection inhibiting signal DEN are respectively connected to first and second input terminals of a NAND circuit 43. Output of the NAND circuit 42 is connected to a third input terminal of the NAND circuit 43 and output of the NAND circuit 43 is connected to a second input terminal of the NAND circuit 42. The NAND circuits 42 and 43 form an SR latch circuit. An output terminal of the NAND circuit 43 generates the enable signal EN and is connected to a second input terminal of the OR circuit 44.

The control circuit 14 inputs an externally supplied clock signal CK, a function selecting signal SEL, a reading operation signal SAD from the module, and an enable signal EN from the detection circuit 15, and further generates, from these input signals, the detection inhibiting signal DEN which inhibits (or stops) a detecting operation of the detection circuit 15, the enable signal EN which permits or inhibits the operation of the decoding circuit row i, and the pre-charge signal NPR which controls the reading operation of the module. In the integrated circuit layout, the control circuit 14 is connected to the detection circuit 15 at an end of a signal line of the enable signal EN from the detection circuit 15 which is disposed in parallel with the direction in which the decoding circuits $i_0$ through $i_{255}$ are arranged, in other words, an end portion of the enable signal line on the side opposite to the detection circuit 15.

Figure 18:
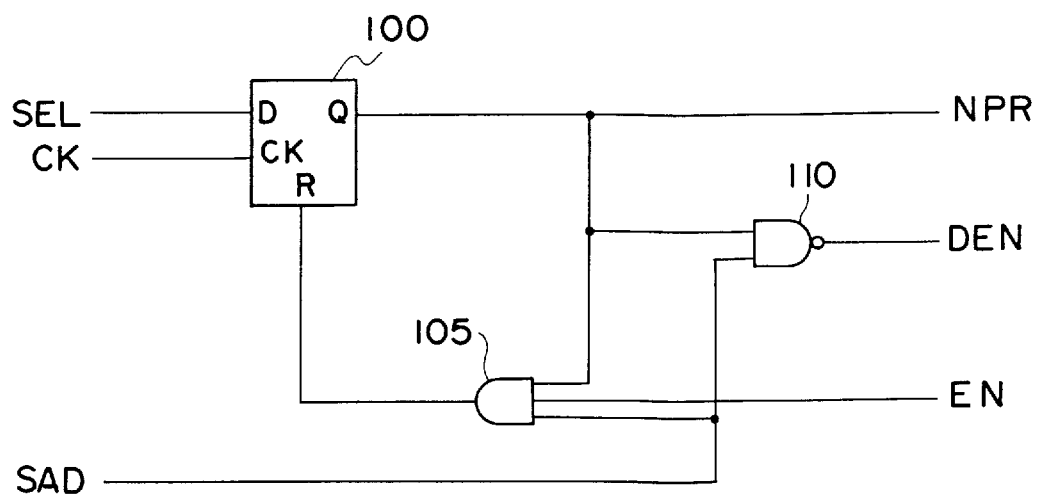
FIG. 18 is a circuit diagram which shows a structural example of a control circuit in the address decoder of the fourth embodiment.

FIG. 18 is a circuit diagram which shows a structural example of the control circuit 14. In this figure, F/F circuit 100 is constructed such that the function selecting signal SEL is connected to D input terminal thereof and the clock signal CK is connected to the clock input terminal CK thereof. The F/F circuit 100 latches the function selecting signal SEL to generate the pre-charge signal NPR. The pre-charge signal NPR is connected to a first input terminal of a NAND circuit 110 and to a first input terminal of an AND circuit 105. The reading operation signal SAD is connected to a second input terminal of the AND circuit 105 and to a second input terminal of the NAND circuit 110, and an output terminal of the NAND circuit 110 generates the detection inhibiting signal DEN. The enable signal EN is connected to a third input terminal of the AND circuit 105 and output of the AND circuit 105 is connected to a reset input terminal R of the F/F circuit 100.

Figure 19:
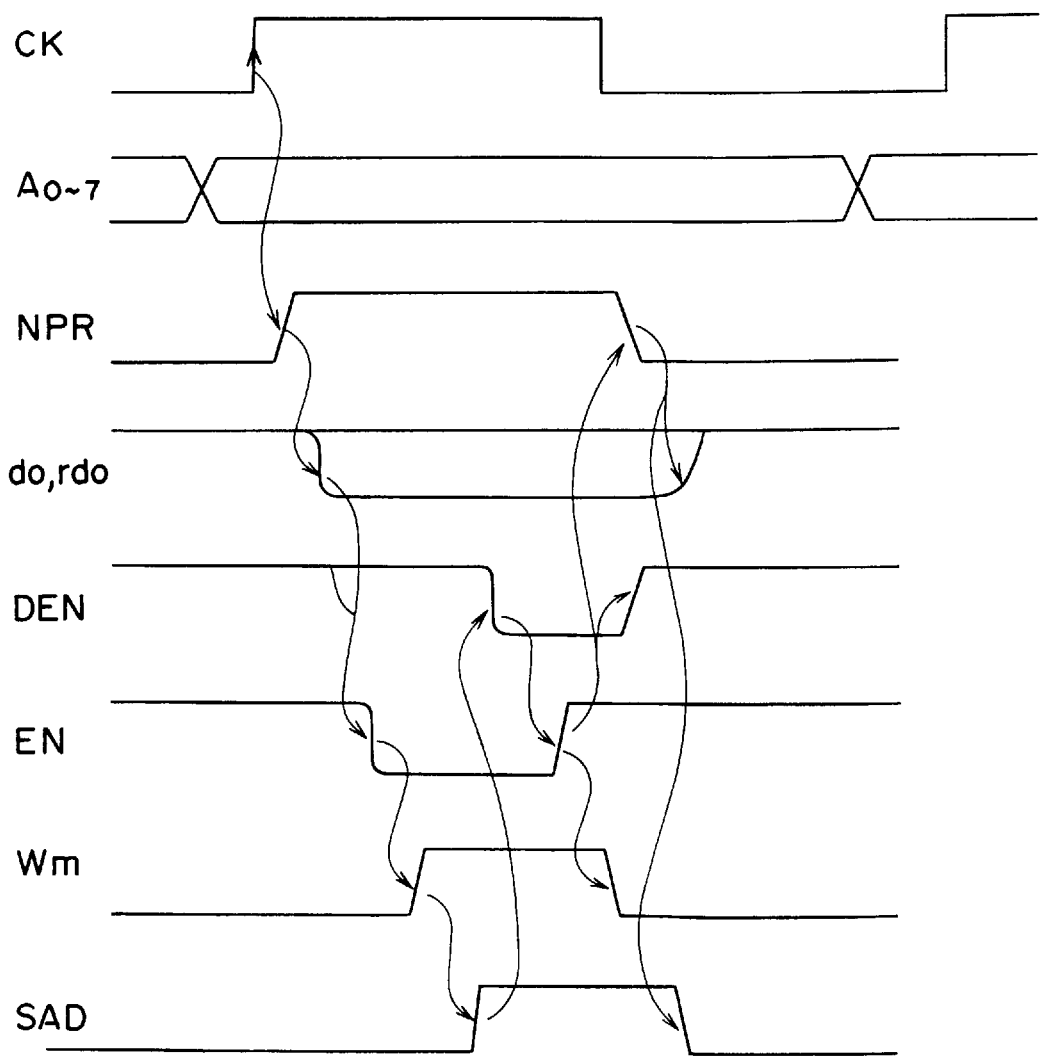
FIG. 19 is an operational timing chart of the address decoder of the fourth embodiment.
Figure 20:
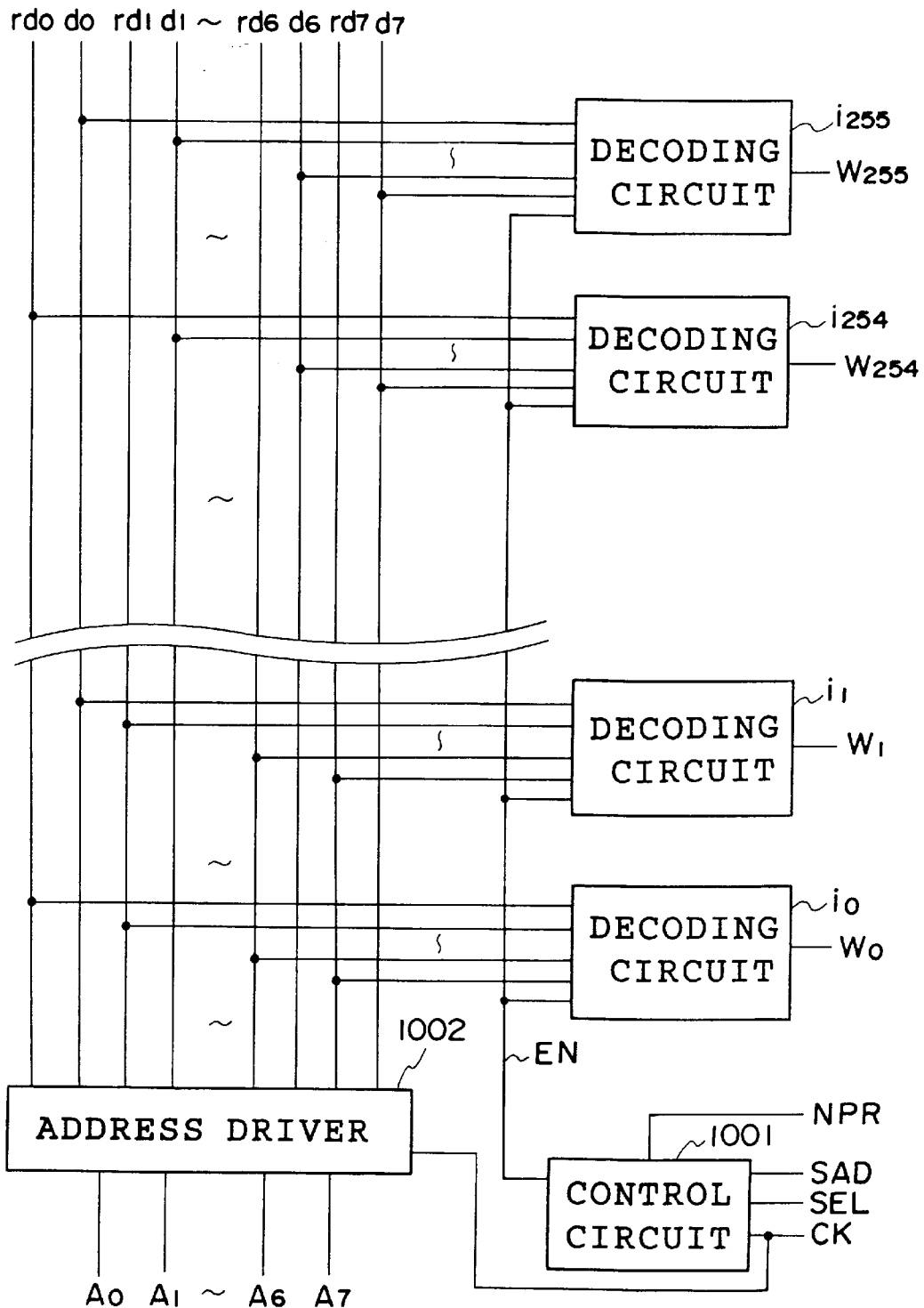
FIG. 20 is a circuit diagram which shows an example of a conventional address decoder.
Figure 21:
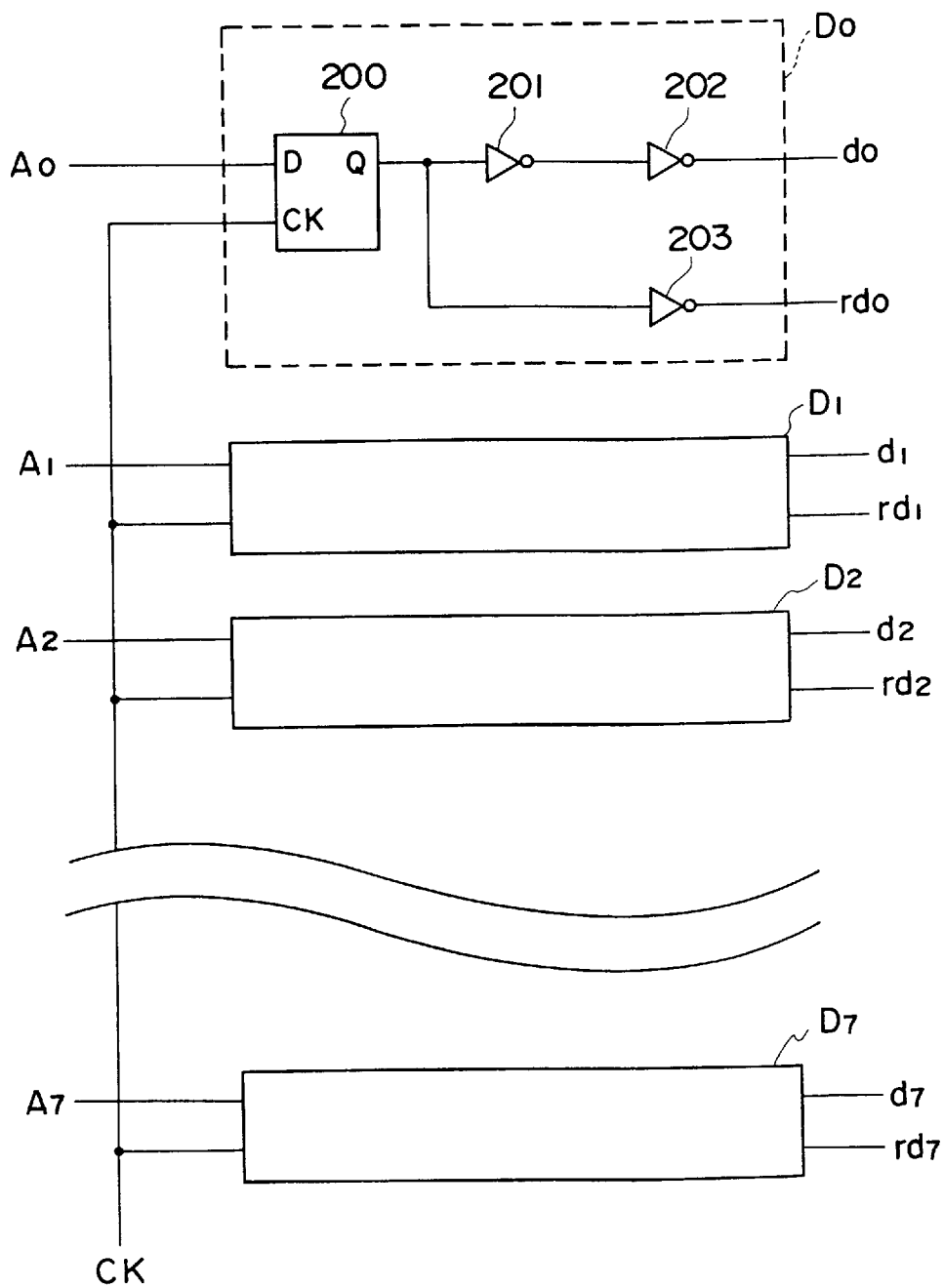
FIG. 21 is a circuit diagram which shows a structural example of an address driver in the conventional address decoder.
Figure 22:
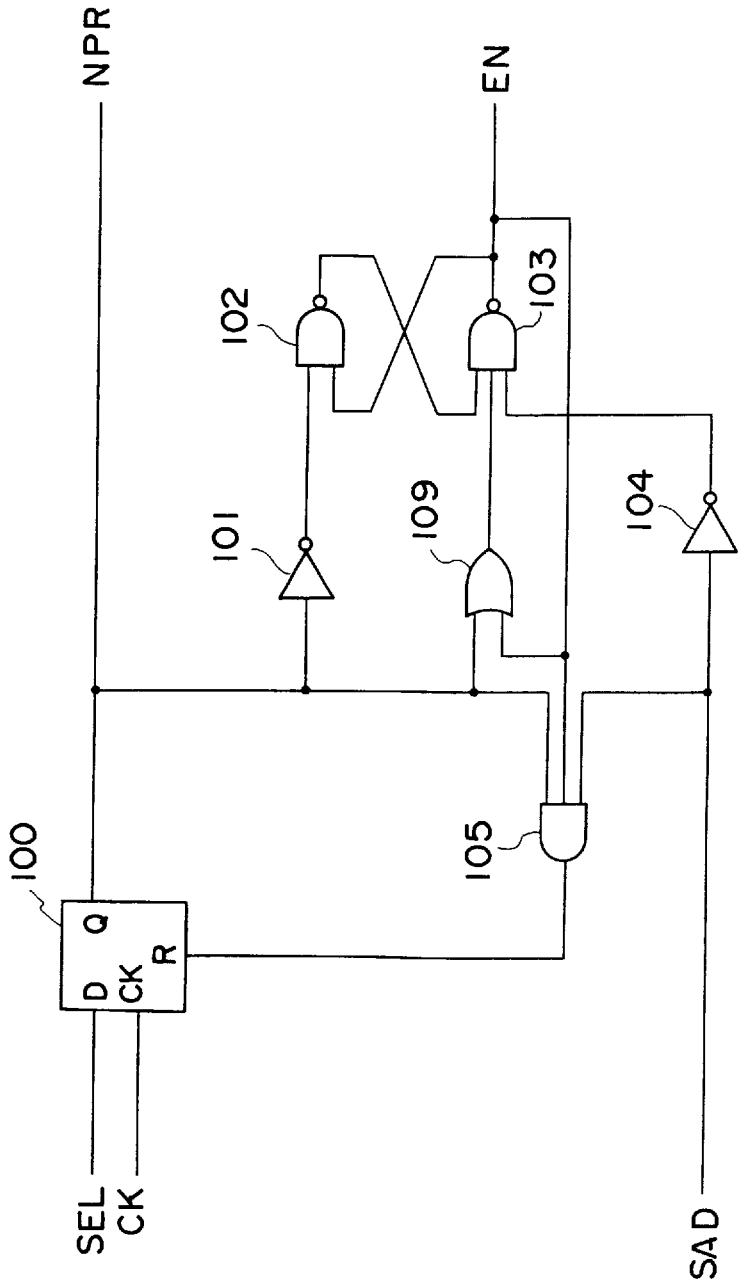
FIG. 22 is a circuit diagram which shows a structural example of a control circuit in the conventional address decoder.
Figure 23:
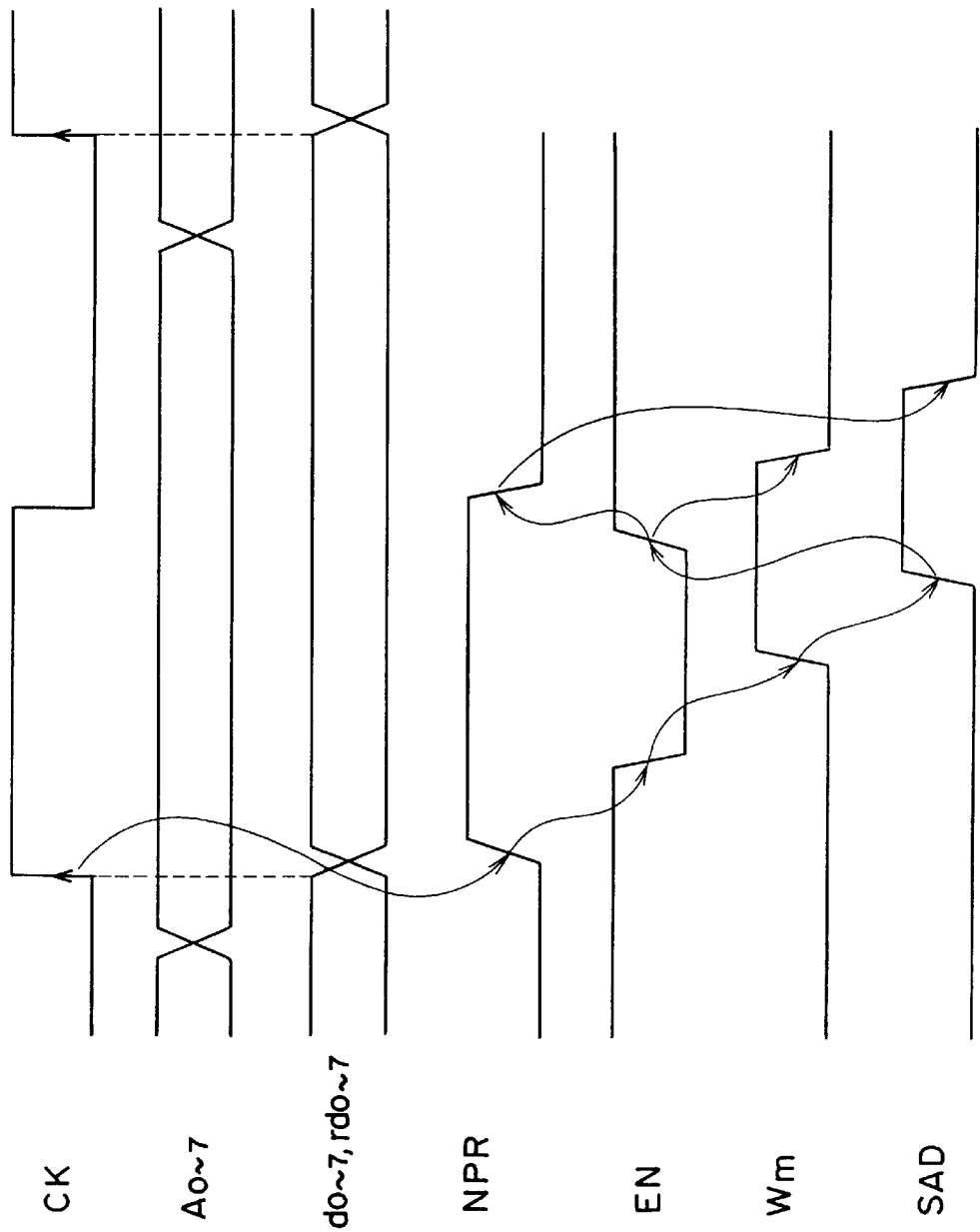
FIG. 23 is an operational timing chart of the conventional address decoder.

Next, the decoding operation of the address decoder shown in FIG. 16 will be described. In the SRAM module of the present invention, reading or writing of data is executed and completed within one cycle of the clock signal CK. FIG. 19 is an operational timing chart of the operation of the address decoder shown in FIG. 16. Note that only the decoding operation during reading of data will be described below. A decoding operation during writing of data is the same as that during reading of data except that other signal corresponding to the reading operation signal SAD is inputted, and therefore, a description thereof will be omitted.

In the waiting state in which the function selecting signal SEL is "0", the pre-charge signal NPR is "0", the memory reading operation signal SAD is "0", and the detection inhibiting signal DEN is "1". The drive signals $d_n$ and $rd_n$ respectively output "1" irrespective of the address signal $A_n$. Further, in the detection circuit 15 shown in FIG. 17, since the drive signals $d_0$ and $rd_0$ are each "1", output of the AND circuit 40 is "1" and output of the NOT circuit 41 is "0". Further, since output of the NAND circuit 43 is inputted to the OR circuit 44, unless output of the OR circuit 44 is "1", stabilization of the circuit is not achieved. For this reason, the enable signal EN is held at "1". Further, output of the NAND circuit 42 is maintained at "0".

Subsequently, when the function selecting signal SEL becomes "1", the pre-charge signal NPR changes to "1" at the rising edge of the clock signal CK to be brought into the discharge state. Further, the address signal $A_n$ is latched at the rising edge of the clock signal CK, and when the drive signals $d_n$ and $rd_n$ are brought into an enabled state due to the change of the pre-charge signal to "1", the positive-phase logical level of the latch output of the address signal $A_n$ is outputted as the drive signal $d_n$ and the negative-phase logical level of the latch output of the address signal $A_n$ is outputted as the drive signal $rd_n$. At this time, in the control circuit 14 shown in FIG. 18, the reading operation signal SAD is "0" and output of the NAND circuit 110 remains unchanged to be held at "1". Therefore, the detection inhibiting signal DEN is held at "1".

Subsequently, when either one of the drive signals $d_0$ and $rd_0$ changes to "0" and this drive signal arrives at the detection circuit 15 positioned farmost from the address driver 2, in FIG. 17, output of the AND circuit 40 becomes "0" and output of the NAND circuit 42 is inverted to "1". As a result, the enable signal EN outputted from NAND circuit 43 changes to "0".

When the enable signal EN changes to "0", the decoding circuit row i is enabled and the one decoding circuit $i_m$ outputs the logical level "1" to the word line $W_m$ and the memory cell $M_m$ indicated by input address data is selected. Further, the enable signal EN "0" is also inputted to the control circuit 14. In FIG. 18, the reading operation signal SAD is "0", and therefore, output of the AND circuit 105 remains unchanged to be maintained at "0".

Subsequently, when the data reading operation is executed within the module in accordance with selection of the memory cell $M_m$, the reading operation signal SAD changes to "1", and the reading operation signal SAD is inputted to the control circuit 14, in FIG. 18, the detection inhibiting signal DEN outputted from the NAND circuit 110 changes from "1" to "0". When the change of the detection inhibiting signal to "0" reaches the detection circuit 15, in FIG. 17, the enable signal EN outputted from the NAND circuit 43 returns to "1". When the enable signal EN returns to "1", the decoding circuit row i is released from an enabled state and the selected word line $W_m$ returns to "0". Further, when the enable signal EN returning to "1" is inputted to the control circuit 14, in FIG. 18, since the reading operation signal SAD is "1" and the pre-charge signal NPR is "1", output of the AND circuit 105 becomes "1" and the pre-charge signal NPR outputted from the F/F circuit 100 is forcibly restored to "0" to be brought into the pre-charge state. As a result, output of the AND circuit 105 also returns to "0".

When the pre-charge signal NPR returns to "0", the drive signals $d_n$ and $rd_n$ both return to "1", and therefore, the detection inhibiting signal DEN also returns to "1". Further, the reading operation signal SAD also returns to "0". As a result, a series of decoding operation during reading of data is completed.

As described above, according to the fourth embodiment, determination of the input drive signals in the decoding circuits $i_0$ through $i_{255}$ can be detected in such a manner that a drive signal line pair $d_0$ and $rd_0$ among the drive signal line pairs is connected to the detection circuit 15 at an end portion of each of the signal lines on the side opposite to the address driver 2 and the change of the logical level of either one signal line of the signal line pair is monitored. Further, the decoding operation is executed in such a manner that when the change of the drive signal to "0" is detected, the enable signal EN from the detection circuit 15 is changed to "0" and accordingly the logical levels of the input drive signals of 256 decoding circuits are determined before executing the decoding operation. As a result, it is possible to maintain the set-up time so as to prevent occurrence of a malfunction of the module.

Further, it suffices that a simple circuit as shown in FIG. 17 may be used as the detection circuit 15. Accordingly, there is almost no possibility that a layout area increases due to provision of the detection circuit 15, and a layout area having substantially the same area as that of a conventional system will be sufficient.

Further, a completion of a decode-enabled period in the decoding circuits $i_0$ through $i_{255}$ can be detected by the control circuit 14 which is connected with the enable signal line on the side opposite to the detection circuit 15 and monitors the change of the enable signal EN. Accordingly, when the reading or writing operation of the module is completed, the detection circuit 15 receives the detection inhibiting signal DEN outputted from the control circuit 14 and returns the enable signal EN to "1". When the control circuit 14 detects that the enable signal EN has returned to "1", with the pre-charge signal NPR returning from "1" to "0", 256 decoding circuits are provided to return to the pre-charge state after having reliably been brought into a decode-disabled state, thereby making it possible to maintain the holding time of the drive signals for the enable signal.

Further, a series of operations in the fourth embodiment is constructed such that the address decoder is actuated at the rising edge of the clock signal CK, executed in asynchronous manner up to completion of the cycle, and is not affected by variation of the delay time of the input drive signals in each decoding circuit, and also the decoding operation starts immediately after determination of the input drive signal, and when the reading or writing operation of the module is completed, the decoding circuits are immediately brought into the pre-charge state with the holding time being maintained. For this reason, a high-speed operation without occurrence of malfunction can be effected.

Moreover, in the fourth embodiment, when the change of the drive signal $d_0$ or $rd_0$ to "0" is detected by the detection circuit 15, the enable signal EN immediately changes to "0" so as to be brought into the decode-enabled state. For this reason, as compared with the first, second and third embodiment in which after the detection signal BS returns to the control circuit, the control circuit changes the enable signal EN to "0", an enable starting time of the decoding operation becomes faster and a timing of selection of the word line $W_m$ by the decoding circuit row i can be made still faster.

In the above-described fourth embodiment, the direction and wiring length of the drive signal lines are made uniform and the wiring capacity and wiring resistance are the same in these drive signal lines. However, these conditions are not necessarily required. For example, the drive signal line pair which is regarded as that having the maximum signal delay time may be monitored by the detection circuit 15. Further, in the above-described fourth embodiment, the logical level of the drive signal in the pre-charge state is set to "1", but the logical level of the drive signal in the pre-charge state may be set to "0" and the logical level detected by the detection circuit 15 may be set to "1".

Further, there may be applied a structure in which the address driver outputs the drive signals $d_0$, $rd_0$ and $d_1$ through $d_7$, and the first and second decoding circuits j and i are provided as the decoding circuit row, in the same way as in the second embodiment.

As described above, in accordance with the address decoder according to the first embodiment of the present invention, determination of the input drive signals in the decoding circuits can be detected in such a manner that at least one of the drive signal pairs is connected to the detection circuit at an end portion of each of the drive signal line pair, which is opposite to the address driver and the detection circuit monitors the change of the logical level of the drive signal line to the second logical level. Accordingly, by receiving the detection signal outputted from the detection circuit and outputting the enable signal by the control circuit, the decoding operation is executed after determination of each logical level of the input drive signals of all decoding circuits. As a result, it is possible to maintain the set-up time so as to prevent occurrence of a malfunction of the module. Further, since the decoding operation starts immediately after the input drive signals have been determined, a high-speed operation is allowed. In addition, it suffices that a simple circuit may be used as the detection circuit, and therefore, there is almost no possibility that a layout area increases due to provision of the detection circuit and a layout area having substantially the same area as that of a conventional system may suffice.

Further, in accordance with the address decoder according to the second embodiment of the present invention, the total number of drive signal lines can be lessened, and therefore, a layout area in which these signal lines are arranged can be reduced.

Moreover, in accordance with the address decoder according to the third embodiment of the present invention, in addition to the above functions, completion of a decode-enabled period in the decoding circuits can be detected by the detection circuit which is connected with the enable signal line at an end portion of the enable signal line on the side opposite to the control circuit and monitors the change of the enable signal. Accordingly, when the detection circuit detects that output of the enable signal has stopped, the control circuit receives the second detection signal outputted from the detection circuit so as to re-start output of the pre-charge signal, all of the decoding circuits are reliably brought into the decode-disabled state before returning to the pre-charge state. As a result, it is possible to allow a high-speed operation without occurrence of malfunction with the holding time of the drive signals for the enable signal being maintained.

Still further, in accordance with the address decoder according to the fourth embodiment of the present invention, in addition to the functions of the first and second embodiment, completion of a decode-enabled period in the decoding circuits can be detected by the control circuit which is connected with the enable signal line at an end portion of the enable signal line on the side opposite to the detection circuit and monitors the changeof the enable signal. Accordingly, when reading or writing operation of the module is completed, the detection circuit receives the detection inhibiting signal outputted from the control circuit and stops output of the enable signal EN, and with the control circuit re-starting output of the pre-charge signal due to the stoppage of output of the enable signal EN, all of the decoding circuits are reliably brought into the decode-disabled state before returning to the pre-charge state. As a result, it is possible to allow a high-speed operation without occurrence of malfunction with the holding time of the drive signals for the enable signal being maintained. In addition, when the detection circuit detects that the drive signal has changed to the second logic value, the enable signal EN is immediately outputted to proceed to the decode-enabled state. For this reason, as compared with a case in which the enable signal EN is generated and outputted by the control circuit, an enable starting time of the decoding operation becomes quickened and a decoding timing can be made faster accordingly.

What is claimed is:

1. An address decoder in a synchronous memory module, comprising:

an address driver to which a plurality of address signals are inputted and which generates a pair of drive signals for each of the plurality of address signals and outputs said pair of drive signals to a corresponding pair of drive signal lines which are provided separately, said pair of drive signals both becoming a first logical level in a memory pre-charge period irrespective of a logical level of an inputted address signal, and outputting a positive phase and a negative phase of a logical level of the inputted address signal in a memory discharge period so as to respectively form the first logical level and a second logical level which are different from each other;

a decoding circuit row having a plurality of decoding circuits whose number is same as that of the word lines of the memory module, said decoding circuits each including an enable terminal connected to an enable signal line and a plurality of input terminals which are each connected to either one predetermined signal line of a corresponding pair of drive signals and each decoding the corresponding pair of drive signals in a period in which the enable signal is inputted to said enable terminal;

a detection circuit which is connected to at least one selected pair of drive signal lines among the plurality of pairs of drive signal lines at end portions of said selected pair of drive signal lines on a side opposite to said address driver and which outputs a detection signal which detects that either one of said selected pair of drive signals has changed to the second logical level; and a control circuit which outputs the enable signal when the detection signal is inputted thereto.

2. An address decoder according to claim 1, wherein said detection circuit is formed by a pair of NOT circuits which are respectively connected to either one of said selected pair of drive signal lines and one NOR circuit which allows outputs of the pair of NOT circuits to be connected to separate input terminals thereof.

3. An address decoder according to claim 1, wherein said plurality of drive signal lines are arranged in parallel with one another along a direction in which said decoding circuit row is arranged, said drive signal lines all having same materials and same wiring width.

4. An address decoder according to claim 1, wherein said address driver includes an input terminal of a pre-charge signal and operates in a pre-charge period in which the pre-charge signal is inputted to said address driver and in a discharge period in which the pre-charge signal is not inputted thereto, said control circuit stops output of the pre-charge signal synchronously with a rising edge of an externally inputted clock, and when a first detection signal is inputted, generates and outputs the enable signal to the enable signal line, stops output of the enable signal when data reading or writing operation is completed in the memory module, and further restarts output of the pre-charge signals when a second detection signal is inputted, and said detection circuit is connected to at least one pair of drive signal lines among the plurality of pairs of drive signal lines at end portions of said pair of signal lines on the side opposite to said address driver and is also connected to the enable signal line at an end portion of the enable signal line on the side opposite to said control circuit, and further outputs the first detection signal which detects that either one of said at least one pair of drive signal lines has changed to a second logical level and the second detection signal which detects that input of the enable signal from the enable signal line has stopped.

5. An address decoder according to claim 4, wherein said detection circuit is formed by a pair of NOT circuits respectively connected to either one of said pair of signal lines, an OR circuit which allows outputs of said pair of NOT circuits to be connected to separate input terminals of said OR circuit, and one NAND circuit which allows output of the OR circuit and output of the enable signal line to be respectively connected to separate input terminals of said NAND circuit.

6. An address decoder according to claim 4, wherein said plurality of drive signal lines are arranged in parallel with one another along a direction in which said decoding circuit row is arranged, said drive signal lines all having same materials and same wiring width.

7. An address decoder according to claim 1, wherein address driver includes an input terminal of a pre-charge signal and operates in a pre-charge period in which the pre-charge signal is inputted to said address driver and in a discharge period in which the pre-charge signal is not inputted thereto;

said control circuit is connected to an end portion of the enable signal line and stops output of the pre-charge signal synchronously with a rising edge of an externally inputted clock, outputs a detection inhibiting signal when data reading or writing operation is completed in the memory module, and further restarts output of the pre-charge signal when it is detected that input of the enable signal from the enable signal line has stopped, and said detection circuit is connected to at least one pair of drive signal lines of the plurality of pairs of drive signals at end portions of each of said pair of signal lines on the side opposite to said address driver and is also connected to the enable signal line at an end portion of the enable signal line on the side opposite to said control circuit, and further generates the enable signal which detects that either one of said at least one pair of drive signal lines has changed to a second logical level and outputs the enable signal to the enable signal line, and when the detection inhibiting signal is inputted, said detection circuit stops output of the enable signal.

8. An address decoder in a synchronous memory module, comprising:

an address driver to which a plurality of address signals are inputted and which generates, for at least one address signal, a pair of drive signals and outputs said pair of drive signals to a corresponding pair of drive signal lines, said pair of drive signals both becoming a first logical level in a memory pre-charge period irrespective of a logical level of an inputted address signal, and outputting a positive phase and a negative phase of a logical level of the inputted address signal during a memory discharge period, so as to respectively form the first logical level and a second logical level which are different from each other, and further which generates, for each of other address signals, a single drive signal which outputs the same phase of the logical level of each inputted address signal irrespective of the memory pre-charge period or the discharge period, said address driver outputting these drive signals to drive signal lines which are separately provided;

a first decoding circuit row having a plurality of first decoding circuits whose number is same as that of word lines of the memory module, said first decoding circuits inputting said single drive signals and inverting a logical level of predetermined signals of said inputted single drive signals to generate separate drive signals;

a second decoding circuit row having a plurality of second decoding circuits provided to respectively correspond to said first decoding circuits, said second decoding circuits each including an enable terminal connected to an enable signal line, a plurality of input terminals respectively connected to separate drive signal lines which output said separate drive signals fed from said first decoding circuits and an input terminal connected to a predetermined either one of said pair of drive signal lines, each decoding the drive signals in a period in which said enable signal is inputted to the enable terminal;

a detection circuit which is connected to the drive signal lines of said pair of drive signals at end portions of said pair of drive signal lines on a side opposite to said address driver and which outputs a detection signal which detects that either one of said pair of drive signal lines has changed to the second logical level; and a control circuit which outputs the enable signal when the detection signal is inputted thereto.

9. An address decoder according to claim 8, wherein said detection circuit is formed by a pair of NOT circuits which are respectively connected to either one of said pair of drive signal lines and one NOR circuit which allows outputs of the pair of NOT circuits to be connected to separate input terminals thereof.

10. An address decoder according to claim 8, wherein said plurality of drive signal lines are arranged in parallel with one another along a direction in which said decoding circuit row is arranged, said drive signal lines all having same materials and same wiring width.

11. An address decoder according to claim 8,
wherein said address driver includes an input terminal of a pre-charge signal and operates in a pre-charge period in which the pre-charge signal is inputted to said address driver and in a discharge period in which the pre-charge signal is not inputted thereto, said control circuit stops output of the pre-charge signal synchronously with a rising edge of an externally inputted clock, and when a first detection signal is inputted, generates and outputs the enable signal to the enable signal line, stops output of the enable signal when data reading or writing operation is completed in the memory module, and further restarts output of the pre-charge signal when a second detection signal is inputted, and said detection circuit is connected to the drive signal lines of said drive signal pair at end portions of the drive signal lines on the side opposite to said address driver and is also connected to the enable signal line at an end portion of the enable signal line on the side opposite to said control circuit, and further outputs the first detection signal which detects that either one of said pair of drive signal lines has changed to a second logical level and the second detection signal which detects that input of the enable signal from the enable signal line has stopped.

12. An address decoder according to claim 11, wherein said detection circuit is formed by a pair of NOT circuits respectively connected to either one of said pair of signal lines, an OR circuit which allows outputs of said pair of NOT circuits to be connected to separate input terminals of said OR circuit, and one NAND circuit which allows output of the OR circuit and output of the enable signal line to be respectively connected to separate input terminals of said NAND circuit.

13. An address decoder according to claim 11, wherein said plurality of drive signal lines are arranged in parallel with one another along a direction in which said decoding circuit row is arranged, said drive signal lines all having same materials and same wiring width.

14. An address decoding method in an address decoder of a synchronous memory module, said address decoder comprising:

an address driver which outputs drive signals for a plurality of address signals inputted from an exterior of the memory module to drive signal line pairs which are separately provided as a plurality of drive signal pairs;

a decoding circuit row having decoding circuits whose number is same as that of the word lines of the memory module, said decoding circuits each including an enable terminal connected to an enable signal line and a plurality of input terminals which are each connected to either one predetermined signal line of a corresponding pair of drive signals and each decoding the corresponding pair of drive signals in a period of time in which the enable signal is inputted to the enable terminal;

a detection circuit which is connected to at least one pair of drive signal lines of the plurality of pairs of drive signal lines at end portions of said drive signal lines on a side opposite to said address driver and which outputs a detection signal which detects that a logical level of either one signal line of said at least one pair of signal line has changed; and a control circuit which outputs the enable signal when the detection signal is inputted to said control circuit, wherein said address decoding method is performed in a cycle of:

in said control circuit, stopping output of the pre-charge signal synchronously with a rising edge of an externally inputted clock and outputting a discharge signal, and thereby in said address driver, changing the logical level of either one signal line of said drive signal pair, outputting a detection signal from said detection circuit which has detected the change of the logical level, outputting the enable signal within said control circuit which has received the detection signal, and thereby in said decoding circuits effecting an address decoding operation, and when a reading operation is completed, providing a read completion signal to said control circuit, altering the logical level of the enable signal from said control circuit and stopping output of the enable signal, and thereby stopping output of the discharge signal and stopping output of the read completion signal, and causing the logical level of the changed signal line of said drive signal pair to return to an original logical level.

15. An address decoding method in an address decoder of a synchronous memory module, said address decoder comprising:

an address driver which outputs drive signals for a plurality of address signals inputted from an exterior of the memory module to drive signal line pairs which are separately provided as a plurality of drive signal pairs;

a decoding circuit row having decoding circuits whose number is same as that of the word lines of the memory module, said decoding circuits each including an enable terminal connected to an enable signal line and a plurality of input terminals which are each connected to either one predetermined signal line of a corresponding pair of drive signals and each decoding the corresponding pair of drive signals in a period of time in which the enable signal is inputted to the enable terminal;

a detection circuit which is connected to at least one pair of drive signal lines of the plurality of pairs of drive signal lines at end portions of said drive signal lines on a side opposite to said address driver and also connected to said enable signal line, and which outputs the first detection signal which detects that a logical level of either one signal line of said at least one pair of signal line has changed, and also outputs the second detection signal which detects that input of the enable signal from the enable signal line has stopped; and a control circuit which outputs the enable signal when the first detection signal is inputted to said control circuit, wherein said address decoding method is performed in a cycle of:

in said control circuit, stopping output of the pre-charge signal synchronously with a rising edge of an externally inputted clock and outputting a discharge signal, and thereby in said address driver, changing the logical level of either one signal line of said drive signal pair, outputting a first detection signal by said detection circuit which has detected the change of the logical level, outputting the enable signal within said control circuit which has received the first detection signal and effecting an address decoding operation in said decoding circuits, and concurrently outputting the enable signal to said detection circuit, and when a reading operation is completed, providing a read completion signal to said control circuit, altering the logical level of the enable signal from said control circuit, stopping output of the enable signal, and outputting the enable signal to said detection circuit, and thereby outputting a second detection signal to said control circuit, and thereby stopping output of the discharge signal and stopping output of the read completion signal; and causing the logical level of the changed signal line of the drive signal pair to return to an original logical level.

16. An address decoding method in an address decoder of a synchronous memory module, said address decoder comprising:

an address driver which outputs drive signals for a plurality of address signals inputted from an exterior of the memory module to drive signal line pairs which are separately provided as a plurality of drive signal pairs;

a decoding circuit row having decoding circuits whose number is same as that of the word lines of the memory module, said decoding circuits each including an enable terminal connected to an enable signal line and a plurality of input terminals which are each connected to either one predetermined signal line of a corresponding pair of drive signals, and each decoding the corresponding pair of drive signals in a period of time in which the enable signal is inputted to the enable terminal;

a detection circuit which is connected to at least one pair of drive signal lines of the plurality of pairs of drive signal lines at end portions of said drive signal lines on a side opposite to said address driver and is also connected to the enable signal line, so that it generates the enable signal when it detects that either one of said at least one pair of drive signal lines has changed to a second logical level, and stops output of the enable signal when it receives a detection inhibiting signal; and a control circuit which outputs the detection inhibiting signal to said detection circuit when it receives the enable signal;

wherein said address decoding method is performed in a cycle of:

in said control circuit, stopping output of the pre-charge signal synchronously with a rising edge of an externally inputted clock and outputting a discharge signal, and thereby in said address driver, changing the logical level of either one signal line of said drive signal pair, outputting an enable signal in said detection circuit which has detected the change of the logical level, and thereby in said decoding circuits effecting an address decoding operation, and when a reading operation is completed, providing a read completion signal to said control circuit, receiving the detection inhibiting signal from said control circuit, and altering the logical level of the enable signal at said detection circuit, and thereby stopping output of the discharge signal and stopping output of the read completion signal, and causing the logical level of the changed signal line of said drive signal pair to return to an original logical level.

* * * * *